United States Patent
Nishimura et al.

(10) Patent No.: US 8,404,980 B2
(45) Date of Patent: Mar. 26, 2013

(54) RELAY BOARD AND SEMICONDUCTOR DEVICE HAVING THE RELAY BOARD

(75) Inventors: Takao Nishimura, Kawasaki (JP); Kouichi Nakamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 187 days.

(21) Appl. No.: 12/824,117

(22) Filed: Jun. 25, 2010

(65) Prior Publication Data

US 2010/0258926 A1  Oct. 14, 2010

Related U.S. Application Data

(62) Division of application No. 11/295,472, filed on Dec. 7, 2005, now abandoned.

(30) Foreign Application Priority Data

Sep. 30, 2005  (JP) .................................. 2005-287538

(51) Int. Cl.
*H05K 1/16* (2006.01)
(52) U.S. Cl. .................... 174/260; 174/255; 257/686
(58) Field of Classification Search ................ None
See application file for complete search history.

(56) References Cited

U.S. PATENT DOCUMENTS

| | | | |
|---|---|---|---|
| 3,801,388 A | 4/1974 | Akiyama et al. | |
| 4,694,572 A | 9/1987 | Leber et al. | |
| 5,357,051 A | 10/1994 | Hwang | |
| 5,541,814 A | 7/1996 | Janai et al. | |
| 5,552,966 A | 9/1996 | Nagano | |
| 5,598,031 A | 1/1997 | Groover et al. | |
| 6,316,838 B1 | 11/2001 | Ozawa et al. | |
| 6,740,821 B1 | 5/2004 | Jiang et al. | |
| 6,917,120 B2 | 7/2005 | Konno | |
| 6,958,532 B1 | 10/2005 | Nakayama | |
| 6,979,905 B2 | 12/2005 | Nishida | |
| 7,199,304 B2 | 4/2007 | Wienrich | |
| 2003/0230796 A1* | 12/2003 | Ismail et al. .................. | 257/686 |

FOREIGN PATENT DOCUMENTS

| | | | |
|---|---|---|---|
| JP | 61-146877 | | 9/1986 |
| JP | 2-109344 | | 4/1990 |
| JP | 2-216839 | | 8/1990 |
| JP | 5-13490 | | 1/1993 |
| JP | 05095074 | * | 4/1993 |
| JP | 8-153939 | | 6/1996 |
| JP | 9-98020 | | 4/1997 |
| JP | 11-265975 | | 9/1999 |
| JP | 2000-013937 A | | 1/2000 |
| JP | 2001-7278 | | 1/2001 |
| JP | 2001-118877 | | 4/2001 |
| JP | 2001-127246 A | | 5/2001 |
| JP | 2001-257307 | | 9/2001 |
| JP | 2002-515175 | | 5/2002 |

(Continued)

OTHER PUBLICATIONS

Japan Patent Office: Office Action mailed Feb. 1, 2011 in corresponding Japanese Patent Applicaton No. 2008-108678, with partial English-language translation.

(Continued)

*Primary Examiner* — Ishwarbhai Patel
(74) *Attorney, Agent, or Firm* — Fujitsu Patent Center

(57) ABSTRACT

A relay board provided in a semiconductor device includes a first terminal, and a plurality of second terminals connecting to the first terminal by a wiring. The wiring connecting to the first terminal is split on the way so that the wiring connects to each of the second terminals.

17 Claims, 28 Drawing Sheets

FOREIGN PATENT DOCUMENTS

| | | |
|---|---|---|
| JP | 2004-153295 | 5/2004 |
| JP | 2004-228323 | 8/2004 |
| JP | 2004-356264 A | 12/2004 |
| WO | WO 95/00973 | 1/1995 |

OTHER PUBLICATIONS

"Japanese Office Action" mailed by JPO and corresponding to Japanese application No. 2005-287538 on Mar. 4, 2008.

"Chinese Office Action" from Chinese Patent Office, in corresponding Chinese Patent Application No. 200510137573.X, mailed May 8, 2009, with English translation.

"Japanese Office Action" from Japanese Patent Office, in corresponding Japanese Patent Application No. 2005-287538, mailed Sep. 2, 2008, with English translation.

"Chinese Office Action" from Chinese Patent Office, in corresponding Chinese Patent Application No. 200510137573.X, mailed Oct. 30, 2009, with English translation.

USPTO, (Ishwarbhai) Non-Final Rejection, Oct. 13, 2009, in parent (section 120 priority) U.S. Appl. No. 11/295,472 [now abandoned].

USPTO, (Ishwarbhai) Final Rejection, Jan. 8, 2009, in parent (section 120 priority) U.S. Appl. No. 11/295,472 [now abandoned].

USPTO, (Ishwarbhai) Non-Final Rejection, Apr. 3, 2008, in parent (section 120 priority) U.S. Appl. No. 11/295,472 [now abandoned].

USPTO, (Ishwarbhai) Restriction Requirement, Jan. 15, 2008, in parent (section 120 priority) U.S. Appl. No. 11/295,472 [now abandoned].

USPTO, (Ishwarbhai) Miscellaneous Action with SSP, Mar. 25, 2010, in parent (section 120 priority) U.S. Appl. No. 11/295,472 [now abandoned].

* cited by examiner

RELAY BOARD AND SEMICONDUCTOR DEVICE HAVING THE RELAY BOARD

CROSS-REFERENCE TO RELATED APPLICATIONS

The present application is a divisional of U.S. patent application Ser. No. 11/295,472, filed Dec. 7, 2005 now abandoned, and is based upon and claims the benefit of priority from the prior Japanese Patent Application No. 2005-287538, filed on Sep. 30, 2005, the entire contents of which are incorporated herein by reference.

BACKGROUND OF THE INVENTION

1. Field of the Invention

The present invention generally relates to relay boards and semiconductor devices having the relay boards, and more specifically, to a relay board used for wiring the semiconductor chips to each other, or the semiconductor chip to and a wiring board or a lead frame, and the semiconductor device having the relay board.

2. Description of the Related Art

A semiconductor device having a structure where at least one semiconductor chip (semiconductor element) and a wiring substrate or a lead frame are connected by a bonding wire is known. In such a semiconductor device, depending on arrangements of electrode pads of the semiconductor chip and bonding pads of the wiring substrate or a bonding lead of the lead frame, crossing or superposing of the bonding wires happens, a length of the bonding wire is too long, or the like so that wire-bonding may be hard to accomplish.

In order to solve such a problem, as shown in FIG. 1, a structure where a relay board for relaying wiring by bonding wires is provided in a semiconductor device has been suggested.

FIG. 1 is a cross-sectional view of a related art semiconductor device having the relay board. Here, FIG. 1-(A) is a cross-sectional view taken along a line X-X' of FIG. 1-(B) which is a plan view of this related art semiconductor device.

Referring to FIG. 1, a semiconductor device 10 has a structure where a first semiconductor chip 6 is mounted on a wiring board 4 having a lower surface where plural bumps 2 are formed. A second semiconductor chip 8 and a relay board 20 are provided on the first semiconductor chip 6.

A bonding pad 1a of the wiring board 4 is connected to an electrode pad 7 of a first semiconductor chip 6 by a bonding wire 3. A bonding pad 1b of the wiring board 4 is connected to a first electrode pad 11 of the second semiconductor chip 8 by a bonding wire 5. A bonding pad 13 of the second semiconductor chip 8 is connected to a first bonding pad 22 of the relay board 20 by a bonding wire 23. A second bonding pad 24 of the relay board 20 is connected to another bonding pad 1b of the wiring board 4 by a bonding wire 25.

The first bonding pad 22 and the second bonding pad 24 of the relay board 20 faces each other. A wiring 26 connects the first bonding pad 22 and the second bonding pad 24 in a straight line state.

Furthermore, the first semiconductor chip 6, the second semiconductor chip 8, the relay board 20, and the bonding wires 3, 5, 23 and 25 are sealed by sealing resin 9 so that the semiconductor 10 is made packaged.

Thus, the relay board 20 is provided between the second electrode pad 13 of the second semiconductor chip 8 and the bonding pad 1b of the wiring board 4 and the second semiconductor chip 8 and the relay board 20 are wire-bonded so that the second semiconductor chip 8 and the wiring board 4 are electrically connected.

In this case, the second electrode pad 13 of the second semiconductor chip 8 is greatly separated from the bonding pad 1b of the wiring board 4. Hence, if the relay board 20 is not provided, a bonding wire having a long wiring length is necessary. However, because of the wiring board 20, the wiring length can be shortened.

In addition, as shown in FIG. 2 and FIG. 3, a relay board having an arrangement of bonding pads different from the example shown in FIG. 1 has been suggested.

FIG. 2 is a plan view of a related art relay board having an arrangement of bonding pads different from the example shown in FIG. 1.

In the relay board 30 shown in FIG. 2, the arrangement direction of a first bonding pad group 31A through 31F is perpendicular to the arrangement direction of a second bonding pad group 32A through 32F. Pads corresponding to each other of the first bonding pad group 31A through 31F and the second bonding pad group 32A through 32F are connected by wiring 33A through 33F extending in an L-shape.

Hence, this structure is effective in a case where the angle between a connecting direction of a bonding wire from a bonding pad and another connecting direction of another bonding wire from another bonding pad is approximately 90 degrees.

FIG. 3 is a plan view of another related art relay board having an arrangement of bonding pads different from the examples shown in FIG. 1 and FIG. 2.

In the relay board 40 shown in FIG. 3, wirings 43A through 43D for connecting first bonding pads 41A through 41D and second bonding pads 42A through 42D are provided so as to be bent on the way plural times (bent line state). Thus, change of the arrangement of the bonding pads is realized.

That is, the first bonding pads 41A through 41D are provided in the vicinity of and along a side (upper side) of the relay board 40. The second bonding pads 42A through 42D are provided in the vicinity of and along a side (lower side) of the relay board 40.

The first bonding pad 41A and the second bonding pad 42A can be electrically connected by the wiring 43A bent on the way plural times. The first bonding pad 41B and the second bonding pad 42B can be electrically connected by the wiring 43B bent on the way plural times. The first bonding pad 41C and the second bonding pad 42C can be electrically connected by the wiring 43C bent on the way plural times. The first bonding pad 41D and the second bonding pad 42D can be electrically connected by the wiring 43D bent on the way plural times.

Furthermore, in addition to the above-discussed examples, a semiconductor device having a structure where a relay board and a semiconductor chip are arranged to be substantially coplanar and connected by wiring-bonding (See Japan Laid-Open Patent Application Publications No. 2-109344 and No. 2-216839), a semiconductor device having a structure where a relay board smaller than a semiconductor chip is mounted on the semiconductor chip (See Japan Laid-Open Patent Application Publications No. 5-13490 and No. 2004-153295), a semiconductor device having a structure where a relay board is provided under a semiconductor chip (See Japan Laid-Open Patent Application Publication No. 2002-515175), a semiconductor device having a structure where plural semiconductor devices are laminated and a semiconductor chip situated at the top and a relay board are arranged side by side (See Japan Laid-Open Patent Application Publication No. 2001-118877), and a semiconductor device having a structure where a relay board is provided in plural laminated semiconductor chips (See Japan Laid-Open Patent Application Publications No. 11-265975 and No. 2001-7278) are known.

However, the size of the semiconductor chip or the wiring board, and the number and the way of arrangement of electrode pads formed on the semiconductor chip or bonding pads formed on the wiring board vary. Therefore, a relay board suitable for a certain semiconductor device is not always suitable for other semiconductor device.

That is, in the related art relay boards, for every semiconductor device, bonding pads of the relay board are positioned corresponding to the arrangement of the electrode pads of the semiconductor chip or the bonding pads of the wiring board or the lead frame. Hence, depending on a positional relationship of the pads of the semiconductor chip and the wiring board, the relay board 20, 30 or 40 shown in FIG. 1 through FIG. 3 cannot correspond. Therefore, a relay board has to be manufactured corresponding to the positional relationship of the pads of the semiconductor chip and the wiring board. Hence, such a relay board cannot be placed in a wide use.

The way of mounting a semiconductor chip on a semiconductor device, the arrangement of electrode pads of a semiconductor chip, or the connection structure between a semiconductor chip and a wiring board or a lead frame may need to be changed. In addition, for the purpose of improvement of yield in manufacturing existing semiconductor devices, positions of the bonding pads of the relay board may need to be changed. The related art relay boards do not correspond to these structures and it is necessary to newly provide a relay board having a different structure.

SUMMARY OF THE INVENTION

Accordingly, it is a general object of the present invention to provide a novel and useful relay board and semiconductor device having the relay board.

Another and more specific object of the present invention is to provide a relay board applied to a semiconductor device, whereby plural bonding pads arranged on the relay board can be optionally selected and/or a connection way of a wiring connecting the bonding pads or a bonding wire can be optionally selected so that the relay board can be applied to semiconductor device having different function or structure.

The above object of the present invention is achieved by a relay board provided in a semiconductor device, including:
a first terminal; and
a plurality of second terminals connecting to the first terminal by a wiring;
wherein the wiring connecting to the first terminal is split on the way so that the wiring connects to each of the second terminals.

The above object of the present invention is also achieved by a relay board provided in a semiconductor device, including:
a first terminal; and
a second terminal;
wherein a connection part is formed by at least one of an end part of a first terminal wire connected to the first terminal and an end part of a second terminal wire connected to the second terminal; and
the first terminal and the second terminal are connected by forming a connection member at the connection part.

The above object of the present invention is also achieved by a semiconductor device, including:
at least a single semiconductor element; and
a wiring board or a lead frame;

wherein the semiconductor element and the wiring board or the lead frame are connected by a relay board;
the relay board includes a first terminal and a second terminal;
a connection part is formed by at least one of an end, part of a first terminal wire connected to the first terminal and an end part of a second terminal wire connected to the second terminal; and
the first terminal and the second terminal are connected by forming a connection member at the connection part.

According to the above-mentioned relay board or semiconductor device, the relay board can be applied to different kinds of semiconductor devices. Hence, it is possible to reduce manufacturing cost of the relay board and the semiconductor device having the relay board.

In addition, wide use of the relay board can improve the degree of freedom of selecting combinations of semiconductor elements mounted on the wiring board or lead frame.

Furthermore, since the place for wire bonding to the relay board can be optionally set, it is possible to improve the yield.

DETAILED DESCRIPTION OF THE PREFERRED EMBODIMENTS

A description is given below, with reference to the FIG. 4 through FIG. 38 of embodiments of the present invention.

For the convenience of explanation, a terminal chip of the embodiment of the present invention is discussed with reference to FIG. 4 through FIG. 29, and then a semiconductor device of the embodiment of the present invention is discussed with reference to FIG. 30 through FIG. 38.

[Terminal Chip]

A terminal chip of the present invention is provided in the semiconductor device and functions as a relay board of a semiconductor chip provided in the semiconductor device.

A relay board of the present invention is a board provided in a semiconductor device, the board being configured to relay wiring such as a bonding wire for connecting a semiconductor chip (semiconductor element), to another semiconductor chip, a wiring substrate or a lead frame.

In the following description, "a first bonding pad" corresponds to "a first terminal" of claims, "a second bonding pad" corresponds to "a second terminal" of claims, "a first bonding pad" corresponds to "a first terminal" of claims, "a wiring connected to the first bonding pad" corresponds to "a first terminal wiring" of claims, and "a wiring connected to the second bonding pad" corresponds to "a second terminal wiring" of claims.

Figure 1:
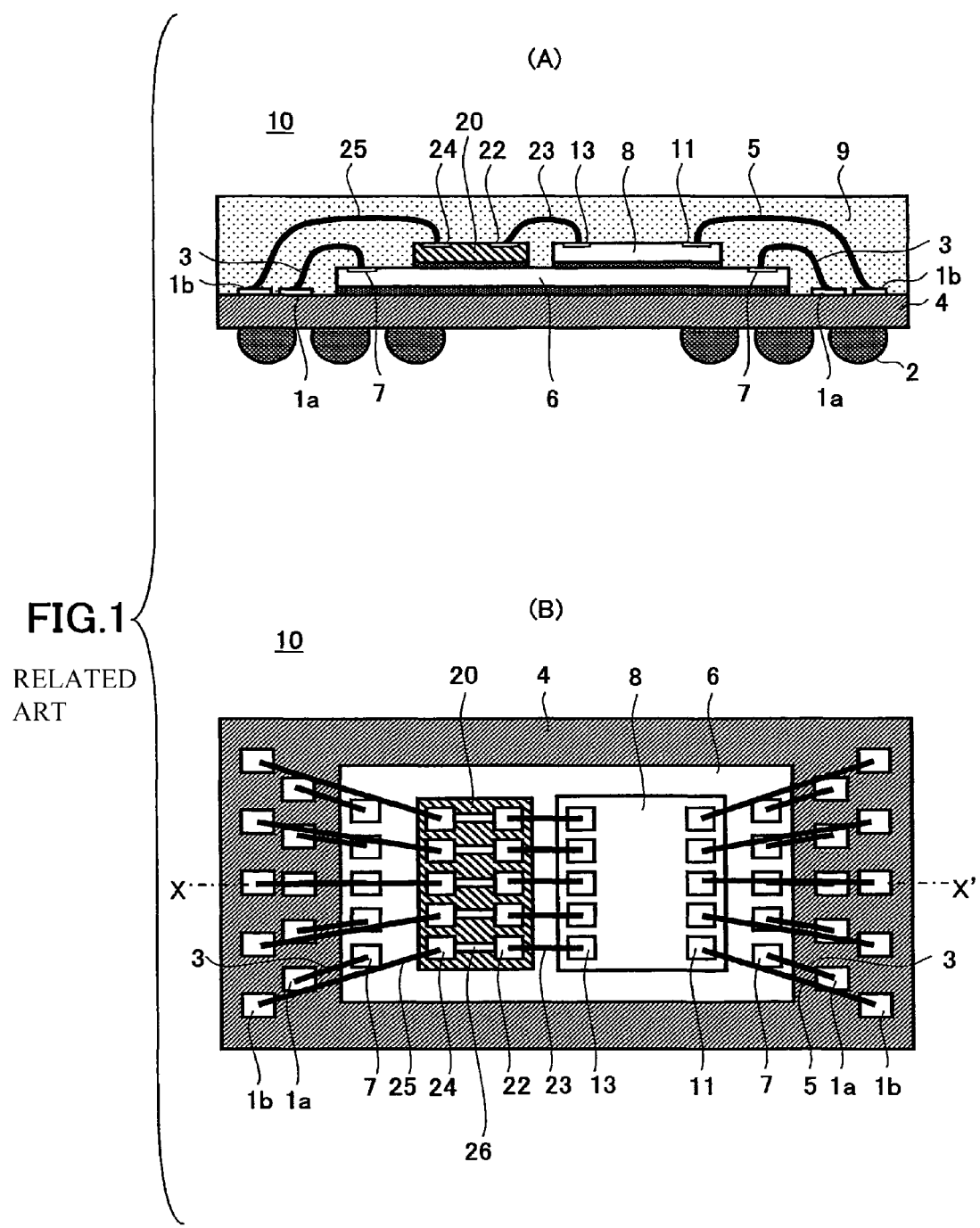
FIG. 1 is a cross-sectional view of a related art semiconductor device having a relay board.
Figure 2:
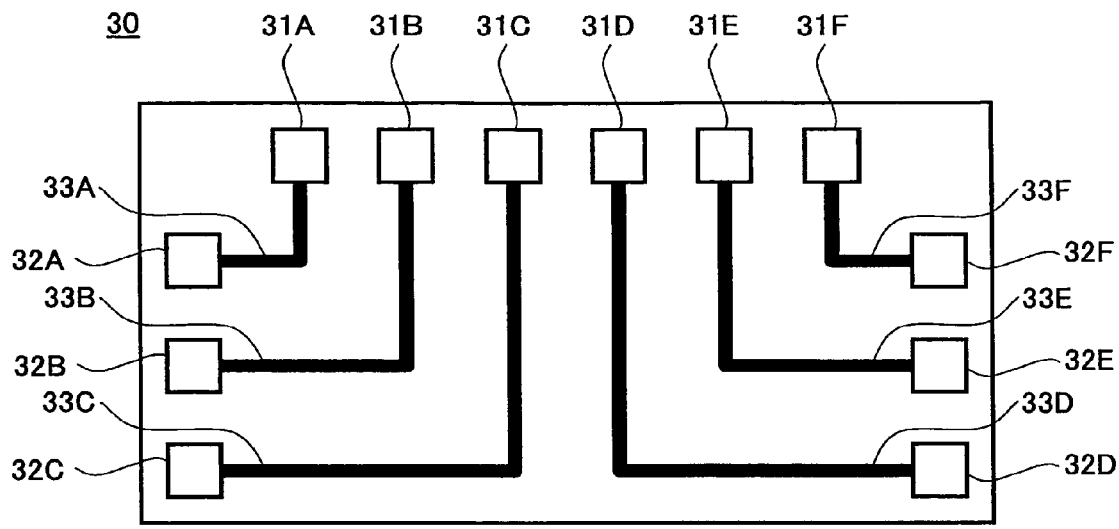
FIG. 2 is a plan view of a related art relay board having an arrangement of bonding pads different from the example shown in FIG. 1.
Figure 3:
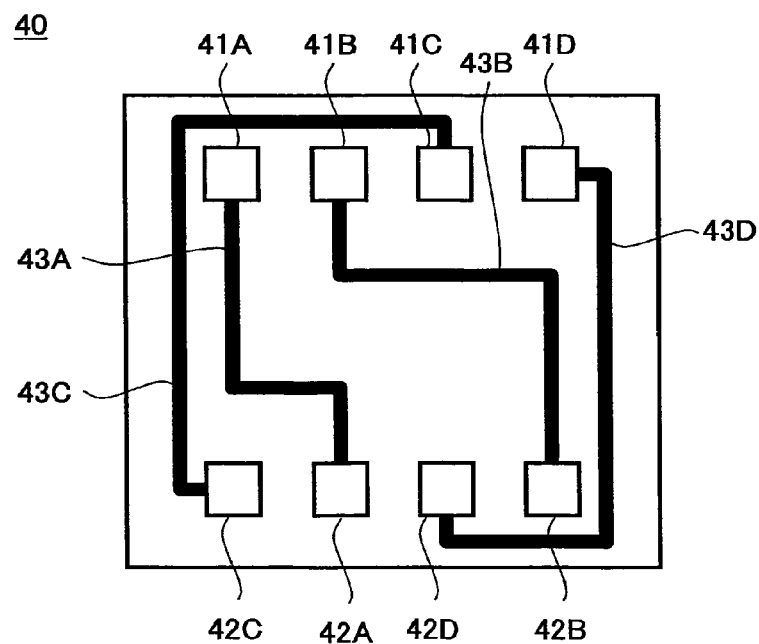
FIG. 3 is a plan view of another related art relay board having an arrangement of bonding pads different from examples shown in FIG. 1 and FIG. 2.
Figure 4:
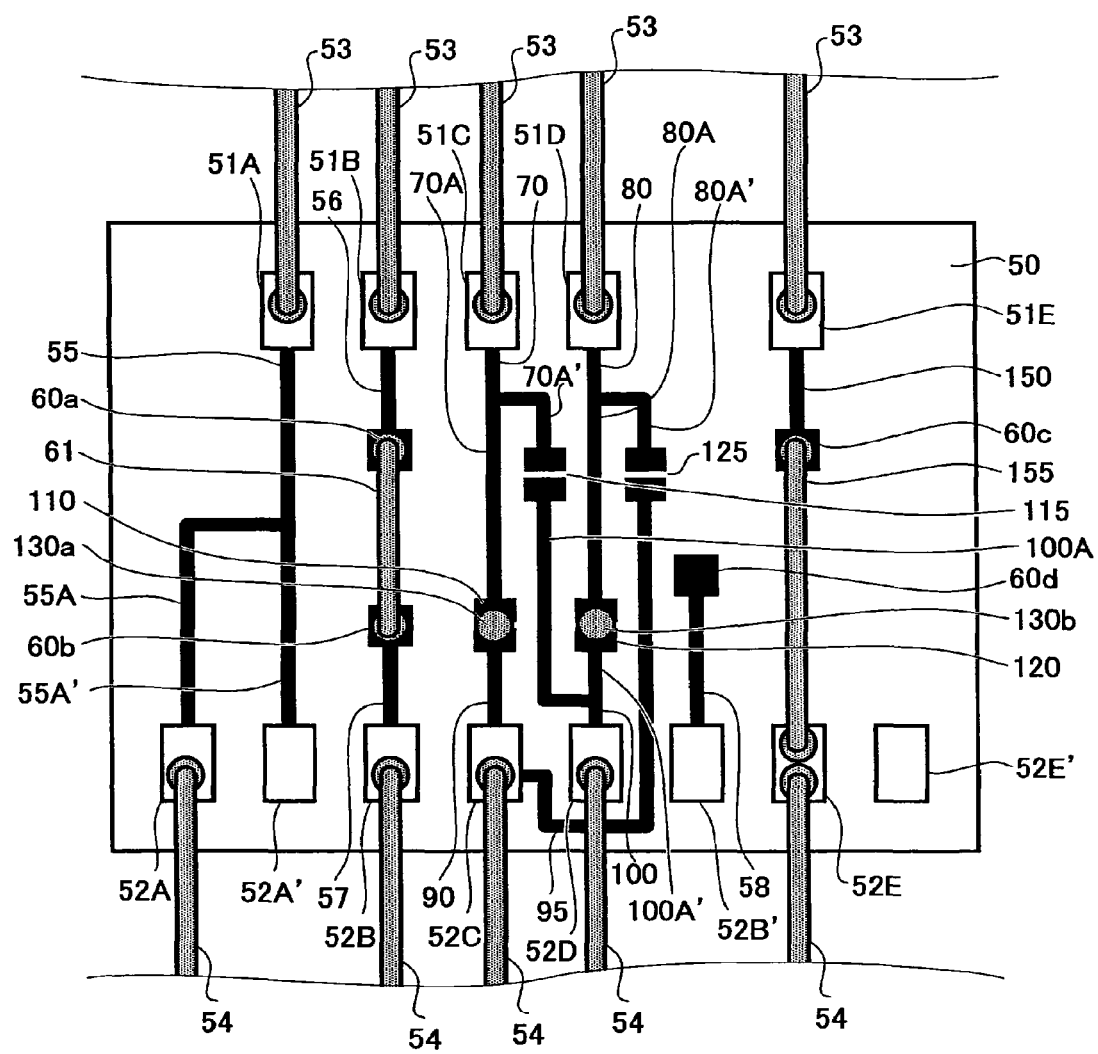
FIG. 4 is a plan view showing a first schematic structure of a relay board of an embodiment of the present invention.

FIG. 4 is a plan view showing a first schematic structure of a relay board 50 of an embodiment of the present invention.

Referring to FIG. 4, first bonding pads 51A through 51E are provided along an upper side of the relay board 50 whose main surface has a substantially rectangular configuration. Bonding wires 53 for electrically connecting to electrode pads of a semiconductor chip (not shown) are connected to the first bonding pads 51A through 51E.

Second bonding pads 52A through 52E, 52A', 52B' and 52E' are provided along a lower side facing the upper side of the relay board 50. Bonding wires 54 for electrically connecting to another semiconductor chip, a wiring board, or a lead frame (not shown) are connected to the second bonding pads 52A through 52E.

The bonding wire 54 is not connected to the second bonding pad 52A' provided between the second bonding pads 52A and 52B and therefore the second bonding pad 52A' functions as a preliminary bonding pad. The bonding wire 54 is not connected to the second bonding pad 52B' provided between the second bonding pads 52D and 52E and therefore the second bonding pad 52B' functions as a preliminary bonding pad. The bonding wire 54 is not connected to the second bonding pad 52E' provided at a right side of the second bonding pad 52E and therefore the second bonding pad 52E' functions as a preliminary bonding pad.

Under this structure, a relationship between the first bonding pad 51A and the second bonding pads 52A and 52A' is discussed. The first bonding pad 51A, the second bonding pad 52A, and the preliminary bonding pad 52A' are connected by a first wiring 55.

More specifically, the first wiring 55 splits (forms multiple paths) on the way so that wiring parts 55A and 55A' are formed. The wiring part 55A connects to the second bonding pad 52A. The wiring part 55A' connects to the second bonding pad 52A'.

That is, the first bonding pad 51A and the second bonding pads 52A and 52A' connected to the first bonding pad 51A by the split first wiring 55 are provided, so that a connection of the bonding wire 54 to either of second bonding pads 52A and 52A' can be selected.

Therefore, corresponding to an arrangement of the pads of the semiconductor chip, wiring board, or lead frame, either of second bonding pad 52A or 52A' having the same electric potential can be selected and the bonding wire 54 can be connected to either of second bonding pads 52A and 52A'.

In a structure shown in FIG. 4, the second bonding pad 52A is selected so that the bonding wire 54 is connected to the second bonding pad 52A. The bonding pad 52A' is not selected and functions as a preliminary bonding pad.

Next, a relationship between the first bonding pad 51B and the second bonding pads 52B and 52B' is discussed.

A second wiring 56 is connected to the first bonding pad 51B. A third wiring 57 is connected to the second bonding pad 52B. A fourth wiring 58 is connected to the second bonding pad 52B' separated from the second bonding pad 52B. Bonding wire connection parts 60 are formed at end parts of the wirings 56 through 58. A detailed structure of the bonding wire connection part 60 is discussed below.

A bonding wire connection part 60a is formed at an end part of the second wiring 56 connected to the first bonding pad 51B. A bonding wire connection part 60b is formed at an end part of the third wiring 57 connected to the second bonding pad 52B. A bonding wire connection part 60d is formed at an end part of the fourth wiring 58 connected to the second bonding pad 52B'. The bonding wire connection part 60a and the bonding wire connection part 60b or the bonding wire connection part 60d can be selectively connected by a bonding wire as a connection member.

That is, corresponding to an arrangement of the pads of the semiconductor chip, wiring board, or lead frame, either of second bonding pads 52B and 52B' having same electric potential can be selected so as to be capable of being connected to the first bonding pad 51B.

In the structure shown in FIG. 4, the bonding wire connection part 60b formed at an end part of the third wiring 57 connected to the second bonding pad 52B is selected.

That is, the bonding wire connection part 60a formed at the end part of the second wiring 56 connected to the first bonding pad 51B and the bonding wire connection part 60b formed at the end part of the third wiring 57 connected to the second bonding pad 52B can be electrically connected by the bonding wire 61 as the connection member. A bonding wire 54 is connected to the second bonding pad 52B.

Thus, above the wiring provided on a surface of the relay board 50, separated bonding wire connection parts 60 can be connected by the bonding wire 61 as a connection member.

On the other hand, the bonding wire 61 is not connected to the bonding wire connection part 60d corresponding to the second bonding pad 52B' and therefore the second bonding pad 52B' functions as a preliminary bonding pad. Accordingly, the bonding wire 54 is not connected to the bonding pad 52B'.

Thus, the degree of freedom of connection at the relay board 50 is improved by providing the bonding wire connection part 60.

Next, a relationship between the first bonding pads 51C and 51D and the second bonding pads 52C and 52D is discussed.

A fifth wiring 70 is connected to a first bonding pad 51C. A sixth wiring 80 is connected to a first bonding pad 51D. A seventh wiring 90 and an eighth wiring 95 are connected to a second bonding pad 52C. Furthermore, a ninth wiring 100 is connected to a second bonding pad 52D.

Here, the fifth wiring 70, the sixth wiring 80, and the ninth wiring 100, as well as the first wiring 55, split on the way so as to form wiring parts 70A and 70A', wiring parts 80A and 80A', and wiring parts 100A and 100A'.

An end part of the wiring, part 70A of the fifth wiring 70 and an end part of the seventh wiring 90 separated from the end part of the wiring part 70A by a designated length form a bump connection part 110. An end part of the wiring part 70A' of the fifth wiring 70 and an end part of the wiring part 100A of the ninth wiring 100 separated from the end part of the wiring part 70A' by a designated length form a bump connection part 115.

An end part of a wiring part 80A of a fifth wiring 80 and an end part of a wiring part 100A' of a ninth wiring 100 separated from the end part of the wiring part 80A at a designated length form a bump connection part 120. In addition, an end part of a wiring part 80A' of the fifth wiring 80 and an end part of an eighth wiring 95 separated from the end part of the wiring part 80A' at a designated length form a bump connection part 125.

Detailed structures of the bump connection parts 110, 115, 120, and 125 are discussed below. Stud bumps as connection members can be applied to the bump connection parts 110, 115, 120, and 125. A necessary wiring among the fifth through ninth wirings 70, 80, 90, 95 and 100 can be selected for connection.

In a structure shown in FIG. 4, the bump connection parts 110 and 120 are selected from the bump connection parts 110, 115, 120, and 125. A stud bump 130a is formed so that the end part of the wiring part 70A of the fifth wiring 70 forming the bump connection part 110 is bridged with the end part of the seventh wiring 90.

Furthermore, a stud bump 130b is formed so that the end part of the wiring part 80A of the fifth wiring 80 forming the bump connection part 120 is bridged with (connected to) the end part of the wiring part 100A' of the ninth wiring 100.

Therefore, the wiring part 70A of the fifth wiring 70 and the seventh wiring 90 are connected. In addition, the wiring part 80A of the sixth wiring 80 and the wiring part 100A' of the ninth wiring 100 are connected.

As a result of this, the first bonding pad 51C and the second bonding pad 52C can be electrically connected, and the first bonding pad 51D and the second bonding pad 52D can be electrically connected.

On the other hand, the stud bumps are not formed at the bump connection parts 115 and 125. Therefore, the wiring part 70A' of the fifth wiring 70 and the wiring part 100A of the ninth wiring 100 are not electrically connected. In addition, the wiring part 80A' of the sixth wiring 80 and the eighth wiring 95 are not electrically connected.

As a result of this, the first bonding pad 51C and the second bonding pad 52D is not electrically connected, and the first bonding pad 51D and the second bonding pad 52C are not electrically connected.

In this embodiment, a stud bump is used as the connection member. In a case of the stud bump, since equipment such as wire bonder or bump bonder and a material such as a metal wiring made of gold used in a manufacturing process of a semiconductor device can be used, special equipment and material are not necessary and therefore high productivity can be achieved. Therefore, it is possible to form the connection member easily and at low cost.

However, in the present invention, the connection member is not limited to the stud bump. As the connection member, for example, a conductive resin paste containing fine particles such as silver, copper or carbon can be used. By using such a conductive resin paste, it is possible to easily adjust the size or height of the connection member formed at the connection part so that the height of the connection member can be reduced. Therefore, it is possible to make the semiconductor device where the relay board is mounted thin (a thin relay board).

Thus, in the relay board of the present invention, depending on the size and/or arrangement of the pads of the semiconductor chip and the wiring board or the lead frame, the bonding pads 51C or 51D and 52C or 52D can be optionally selected. Based on the selection of the bonding pads, to which of the connection parts 110, 115, 120 and 125 the connection member such as the stud bumps are to be arranged, may be determined. Hence, it is possible to improve the degree of freedom of connection of the plural separated connection parts in the relay board.

Next, a relationship between the first bonding pad 51E and the second bonding pads 52E and 52E' is discussed.

A tenth wiring 150 is connected to the first bonding pad 51E. A bonding wire connection part 60c is formed at an end part of the tenth wiring 150, as well as a bonding wire connection part 60a being formed at the end of the second wiring 56.

The bonding wire connection part 60c and the second bonding pad 52E or 52E' can be selectively connected by using a bonding wire as the connection member. That is, depending on the arrangement of the pads of the semiconductor chip and the wiring board or the lead frame, the bonding pad 52E or 52E' can be optionally selected.

In the structure shown in FIG. 4, a bonding wire connection part 60c and the second bonding pad 52E are connected by the bonding wire 155. More specifically, at the second bonding part 52E, the bonding wire 155 is connected end to end at a part where the bonding wire 54 is connected. On the other hand, the bonding wire 155 is not connected to the second bonding pad 52E', so that the second bonding pad 52E' functions as a preliminary bonding pad.

Figure 5:
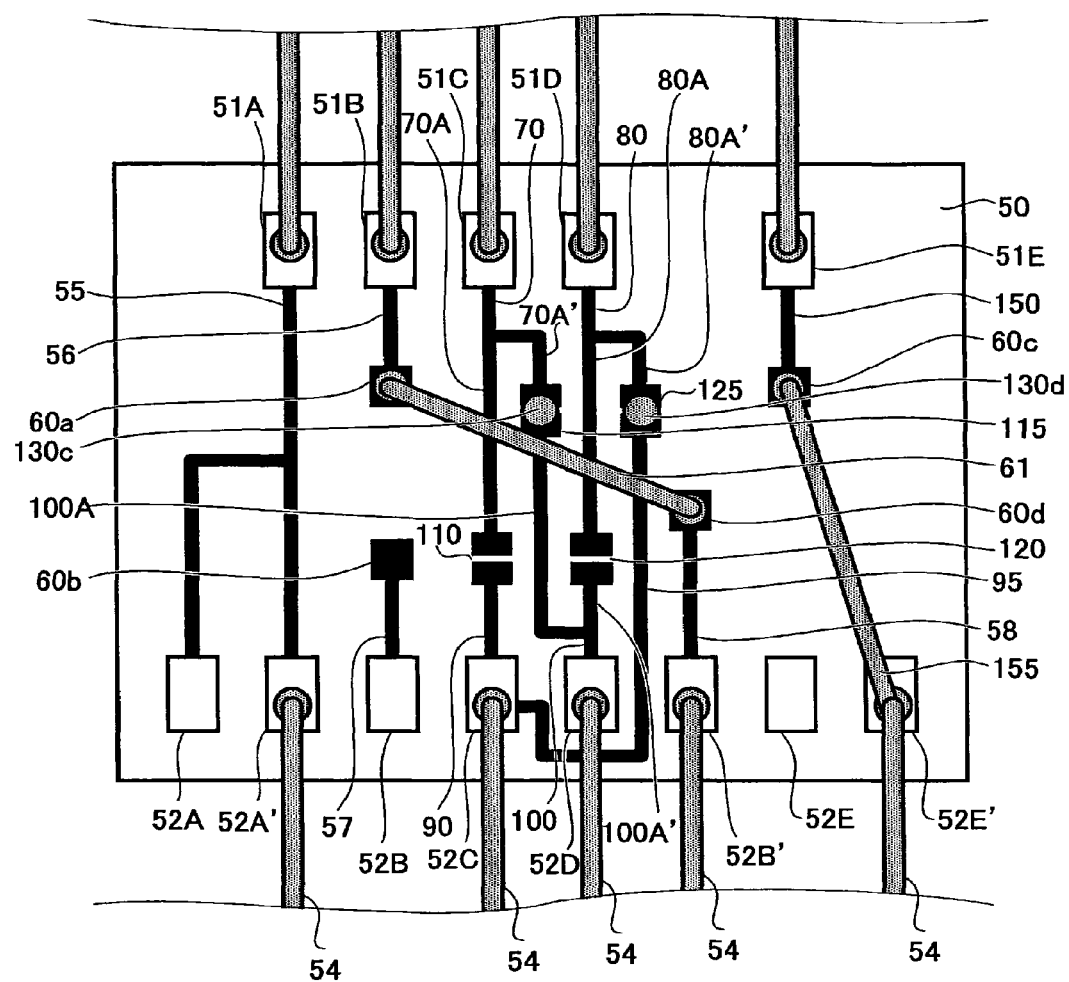
FIG. 5 is a plan view showing a second schematic structure of a relay board of an embodiment of the present invention.

Next, an example where, in the relay board 50, by changing a forming part of the stud bump 130 and connection parts of the bonding wires 61 and 155, second bonding pads 52A', 52B' and 52E' are each selected as a second bonding pad to which a bonding wire 54 is connected, the second bonding pad 52D is selected as a pad to which a first bonding pad 51C is electrically connected, and the second bonding pad 52C is selected as a pad to which a first bonding pad 51D is electrically connected, is discussed with reference to FIG. 5.

FIG. 5 is a plan view showing a second schematic structure of the relay board 50 of the first embodiment of the present invention.

First, a relationship between the first bonding pad 51A and the second bonding pads 52A and 52A' is discussed.

In the example shown in FIG. 4, the second bonding pad 52A is selected and the bonding wire is connected to the second bonding pad 52A.

However, depending on the arrangement of the pads of the semiconductor chip and the wiring board or the lead frame, it may be preferable to select, as a second bonding pad electrically connected to the first bonding pad 51A, not the second bonding pad 52A but the second bonding pad 52A' functioning as a preliminary bonding pad in the example shown in FIG. 4 so that the bonding wire 54 is connected to the second bonding pad 52A'.

The first wiring 55 electrically connecting the first bonding pad 51A and the second bonding pad 52A or 52A' splits on the way. Therefore, it is possible to select either of the second bonding pads 52A and 52A' having the same electric potentials. In the example shown in FIG. 5, the second bonding pad 52A' is selected and the bonding wire 54 is connected to the second bonding pad 52A'. On the other hand, the second bonding pad 52A functions as a preliminary bonding pad.

Next, a relationship between the first bonding pad 51B and the second bonding pads 52B and 52B' is discussed.

In the example shown in FIG. 4, the bonding wire connection part 60a formed at the end part of the second wiring 56 connecting to the first bonding pad 51B and the bonding wire connection part 60b formed at the end part of the third wiring 57 connecting to the second bonding pad 52B can be electrically connected by the bonding wire 61.

However, depending on the arrangement of the pads of the semiconductor chip and the wiring board or the lead frame, it may be preferable to select, as a second bonding pad electrically connected to the first bonding pad 51B, not the second bonding pad 52B but the second bonding pad 52B' functioning as a preliminary bonding pad in the example shown in FIG. 4 so that the bonding wire 54 is connected to the second bonding pad 52B'.

In the example shown in FIG. 5, the second bonding pad 52B' is selected as a second bonding pad electrically connecting to the first bonding pad 51B. The bonding wire 61 connects the bonding wire connection part 60a formed at the end part of the second wiring 56 connecting to the first bonding pad 51B and the bonding wire connection part 60d formed at the end part of the fourth wiring 58 connecting to the second bonding pad 52B'. On the other hand, the second bonding pad 52B functions as a preliminary bonding pad.

Next, a relationship between the first bonding pads 51C and 51D and the second bonding pads 52C and 52D is discussed.

In the example shown in FIG. 4, the bump connection parts 110 and 120 are selected from the bump connection parts 110, 115, 120 and 125 and the stud bumps 130 are formed at the bump connection parts 110 and 120. The wiring part 70A of the fifth wiring 70 and the seventh wiring 90 are connected. In addition, the wiring part 80A of the sixth wiring 80 and the wiring part 100A' of the ninth wiring 100 are connected. As a result of this, the first bonding pad 51C and the second bonding pad 52C are electrically connected and the first bonding pad 51D and the second bonding pad 52D are electrically connected.

However, depending on the arrangement of the pads of the semiconductor chip and the wiring board or the lead frame, it may be preferable that the first bonding pad 51D and the second bonding pad 52C are electrically connected and the first bonding pad 51C and the second bonding pad 52D are electrically connected.

In the example shown in FIG. 5, the stud bumps 130c and 130d are formed at the bump connection parts 115 and 125. The wiring part 70A' of the fifth wiring 70 and the wiring part 100A of the ninth wiring 100 can be electrically connected. In addition, the wiring part 80A' of the sixth wiring 80 and the eighth wiring 95 can be electrically connected. As a result of this, the first bonding pad 51C and the second bonding pad 52D can be electrically connected and the first bonding pad 51D and the second bonding pad 52C can be electrically connected.

On the other hand, the stud bumps are not formed at the bump connection parts 110 and 120. Therefore, the wiring part 70A of the fifth wiring 70 and the seventh wiring 90 are not electrically connected. In addition, the wiring part 80A of the sixth wiring 80 and the wiring part 100A' of the ninth wiring 100 are not electrically connected. As a result of this, the first bonding pad 51C and the second bonding pad 52C are not electrically connected and the first bonding pad 51D and the second bonding pad 52D are not electrically connected.

Next, a relationship between the first bonding pad 51E and the second bonding pads 52E and 52E' is discussed.

In the example shown in FIG. 4, the bonding wire connection part 60 formed at the end part of the tenth wiring 150 and the second bonding pad 52E can be electrically connected by the bonding wire 155.

However, depending on the arrangement of the pads of the semiconductor chip and the wiring board or the lead frame, it may be preferable to select, as a second bonding pad electrically connected to the first bonding pad 51E, not the second bonding pad 52E but the second bonding pad 52E' functioning as a preliminary bonding pad in the example shown in FIG. 4 so that the bonding wire 54 is connected to the second bonding pad 52E'.

In the example shown in FIG. 5, the second bonding pad 52E' is selected. At the second bonding pad 52E', bonding wire 54 is stuck on and connected to the bonding wire 155. On the other hand, the bonding wire is not connected to the second bonding pad 52E. Hence, the second bonding pad 52E functions as a preliminary pad. A connection structure of the bonding wires 54 and 155 to the second bonding pad 52E' is discussed below.

Meanwhile, the relay board 50 of the present invention and relay boards having other structures as discussed below can be made of a material the same as the semiconductor chip provided in the semiconductor device where the relay board is mounted, such as silicon (Si). In this case, a wiring, a bonding pad or the like is formed on the silicon substrate through the same process as the manufacturing process for the semiconductor chip.

That is, an insulation layer such as a silicon oxide film is formed on a main surface of a silicon substrate and a metal layer such as an aluminum (Al) layer is formed on the insulation layer. By making a desirable patter of this by using photolithography technology, plural elements of the relay board including the wiring or the bonding pad are formed. A surface protection film or the like may be formed if necessary. After that, the silicon substrate is cut and divided into individual relay boards.

Therefore, it is possible to manufacture the relay board with high productivity and minute wiring can be easily formed. Because of this, in the relay board, it is possible to form wiring having a complex connection structure at a high yield.

In addition, if the material for the relay board is the same as the material for the semiconductor chip, the coefficient of thermal expansion of the relay board is the same as the coefficient of thermal expansion of the semiconductor chip. In a case of a semiconductor device having a structure where the relay board comes in contact with the semiconductor chip, it is possible to avoid generation of strain or stress concentration due to the difference between the coefficients of the thermal expansion so that it is possible to improve the reliability of the semiconductor device.

Meanwhile, the material for the relay board is not limited to being the same as the material for the semiconductor chip. For example, a printed board made of glass epoxy, glass Bismaleimide-Triazine (BT), or the like may be used for the relay board. Such a printed board is relatively economical and the coefficient of thermal expansion of the relay board can be made the same as or similar to the coefficient of thermal expansion of the wiring board of the semiconductor device. Hence, it is possible to reduce or avoid generation of strain or stress concentration due to the difference of the coefficients of thermal expansion.

A flexible tape substrate such as a polyimide film can be used as such a relay board. In a case of such a tape substrate, it is possible to form minute wiring and make the film thin. In addition, in the case of the flexible tape, even if the tape is adhered to the semiconductor chip, an influence of strain due to the difference of the coefficients of thermal expansion may not be given.

An insulating resin film where a wiring circuit is formed may be used as the material for the relay board.

Next, a structure of the connection part is discussed.

First, a structure of the bonding wire connection part 60 is discussed with reference to FIG. 6.

Figure 6:
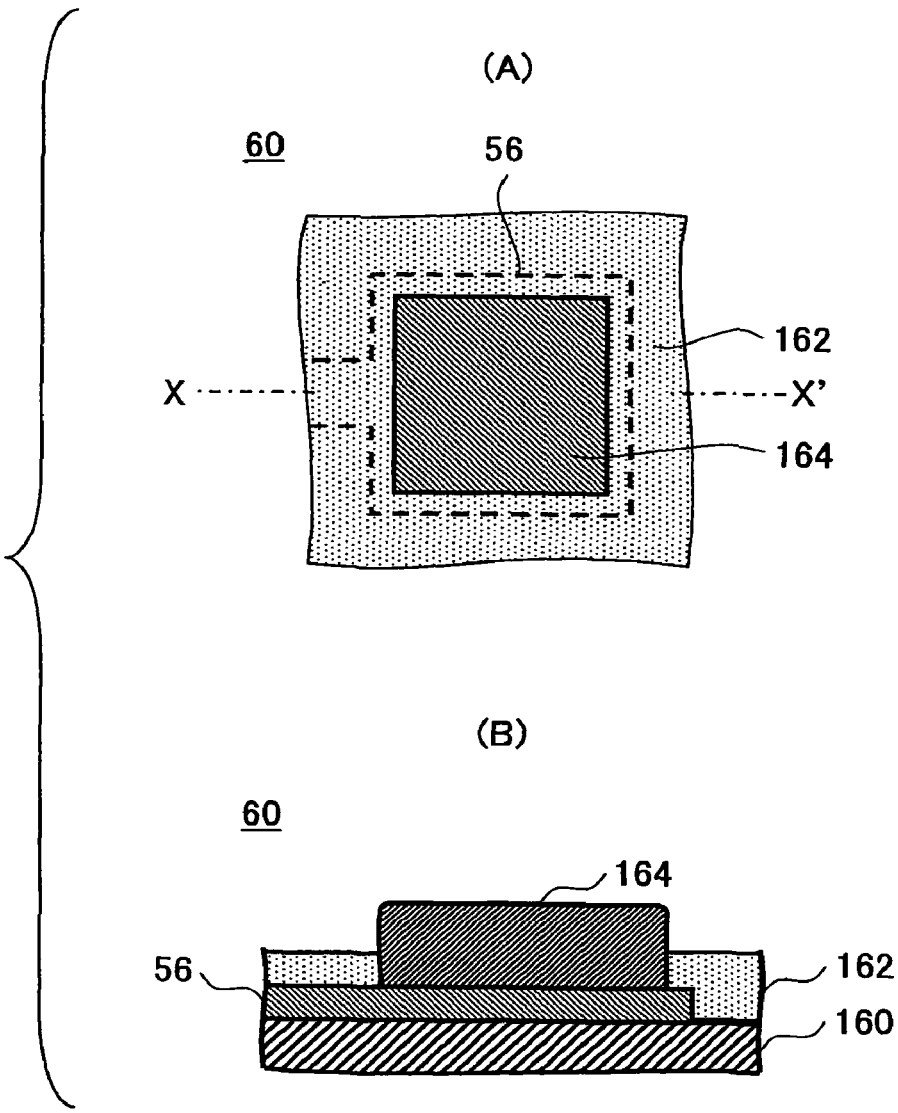
FIG. 6 is a view showing a structure of a bonding wire connection part.

FIG. 6 is a view showing a structure of the bonding wire connection part 60. FIG. 6-(A) is a plan view of the bonding wire connection part 60. FIG. 6-(B) is a cross-sectional view taken along X-X' in FIG. 6-(A).

Referring to FIG. 6, a wiring (for example a second wiring 56 shown in FIG. 4) is formed on the insulation film 160 of the relay board 50.

In a case where the relay board 50 is made of the same material as the material for the semiconductor chip, the insulation layer 160 may be made of a silicon oxide film, for example, formed on the semiconductor substrate made of silicon, for example.

In addition, in a case where the relay board 50 is a printed board made of glass epoxy or a polyimide film, a basic material itself of the relay board 50 is made of insulation material and a basic material part corresponds to the insulation layer. In FIG. 6-(A), the wiring is shown by a dotted line.

The wiring may be made of metal such as aluminum, copper, gold, silver or nickel or an alloy of any thereof. Particularly, it is preferable that the wiring be made of copper if the relay board is a printed board made of glass epoxy or a polyimide film.

As shown in FIG. 6-(A), the width of an end part of the wiring 56, namely the length in a longitudinal direction in FIG. 6-(A), is formed so as to be greater than widths of other parts of the wiring 56.

Figure 7:
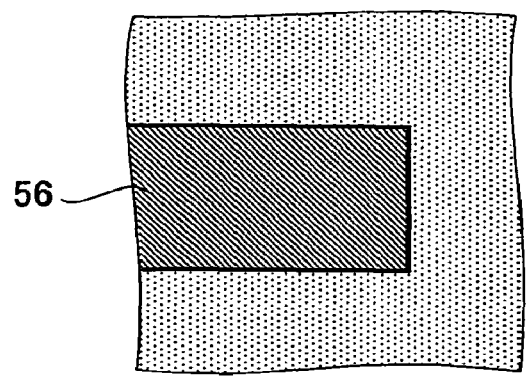
FIG. 7 is a plan view showing a configuration of an end part of a wiring in another example of the bonding wire connection part.
Figure 8:
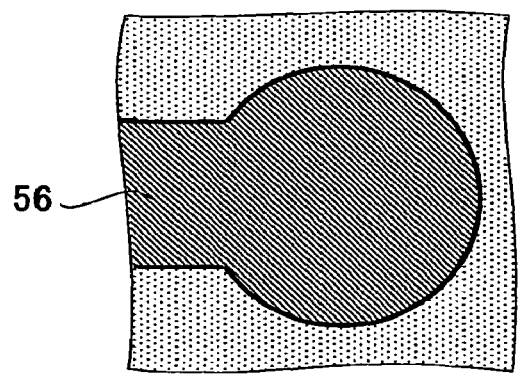
FIG. 8 is a plan view showing a configuration of an end part of a wiring in another example of the bonding wire connection part.

FIG. 7 is a plan view showing a configuration of the end part of the wiring in another example of the bonding wire connection part. FIG. 8 is a plan view showing a configuration of an end part of a wiring in another example of the bonding wire connection part.

The configuration of the end part of the wiring is not limited to the configuration shown in FIG. 6-(A).

For example, as shown in FIG. 7, the end part may be formed so that the width of the end part is the same as the width of other parts of the wiring. Alternatively, as shown in FIG. 8, the end part may have a circular-shaped configuration having a diameter greater than the width of other parts of the wiring.

As shown in FIG. 6, an insulation film 162 is formed on the wiring (for example the second wiring 56). As the insulation film 162, a resin film such as polyimide film or epoxy film, a silicon oxide film, a silicon nitride film, or the like can be used. Furthermore, a multi-layer film may be formed. For example, a double-layer structure of silicon oxide film and silicon nitride film may be used.

It is possible to securely insulate neighboring wirings by forming the insulation film 162 on the wirings. In addition, a short circuit of the wirings due to mixing of metal foreign particles or the like during a manufacturing process of the relay board can be prevented from being generated. Furthermore, corrosion at the wiring made of metal due to moisture or an impurity ion such as $Na^+$, $K^+$, $Cl^-$ or the like can be prevented, In addition, the wiring can be protected from mechanical stress.

In addition, a part of the insulation film 162 covering an end part of the wiring such as the second wiring 56 is opened. A metal plating part 164 is formed in the opening part. A main surface of the metal plating part 164 has a substantially rectangular-shaped configuration.

For example, gold plating, a double-layer plating of nickel and gold, copper plating, or the like is applied as the metal plating part 164. A bonding wire such as the bonding wire 61 is connected to the metal plating part 164. The insulation film 162 or the metal plating part 164 is not always required to be provided.

Next, a structure of the bump connection part 110 is discussed with reference to FIG. 9.

Figure 9:
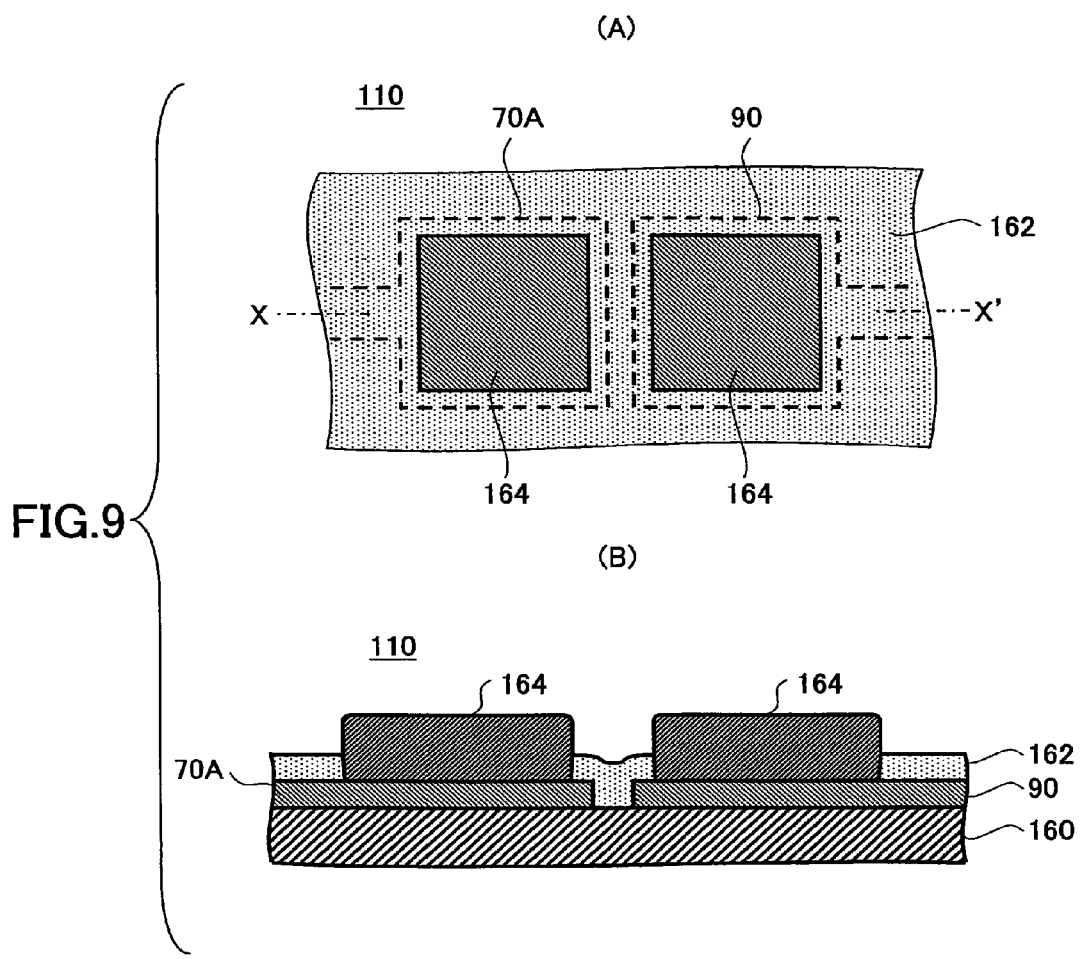
FIG. 9 is a view showing a structure of a bump bonding connection part.

FIG. 9 is a view showing a structure of the bump connection part 110. FIG. 9-(A) is a plan view of the bump connection part 110. FIG. 9-(B) is a cross-sectional view taken along X-X' in FIG. 9-(A).

Referring to FIG. 9, two wirings, for example the wiring part 70A of the fifth wiring 70 and the seventh wiring 90 in a structure shown in FIG. 4, are provided on the insulation layer 160 of the relay board 50 so as to be separated from each other at a designated length and face each other. In FIG. 9-(A), the wirings are shown by dotted lines.

As shown in FIG. 9-(A), the width of an end part of the wiring, namely the length in a longitudinal direction in FIG. 9-(A), is formed so as to be greater than widths of other parts of the wiring.

Since a material for the wiring is already discussed above, the detailed explanation of the material is omitted here.

FIG. 10 through FIG. 15 are plan views showing other examples of the configuration of the end part of the wiring of the bump bonding connection part. As shown in FIG. 10 through FIG. 15, the configuration of the end parts of the wirings facing each other is not limited to the configuration shown in FIG. 9-(A).

Figure 10:
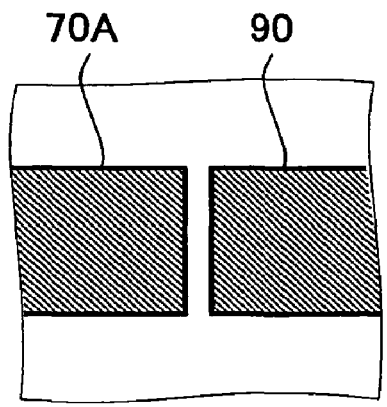
FIG. 10 is a plan view showing a configuration of an end part of a wiring in another example of the bump bonding connection part.
Figure 11:
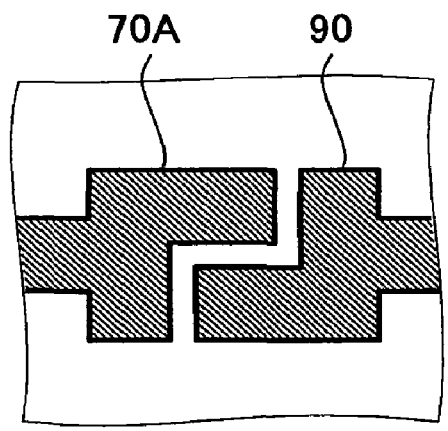
FIG. 11 is a plan view showing a configuration of an end part of a wiring in another example of the bump bonding connection part.

For example, as shown in FIG. 10, the end part may be formed so that the width of the end part is the same as the width of other parts of the wiring part. In addition, as shown in FIG. 11, the end parts of the wirings facing each other have, respectively, L-shaped configurations. That is, if the end part of one of the wiring is rotated 180 degrees, the configuration of the rotated end part is the same as the end part of the other wiring.

In FIG. 10, the connection member such as the stud bump is provided in the center of a part where the end parts of the wirings facing each other are separated from each other. However, if the position where connection member is provided is shifted to an upper, lower, right or left side, a desirable connection may not be obtained.

However, if the end parts of the wirings have configurations shown in FIG. 11, by making the length of parts facing each other of the end parts of the wirings long, even if position where connection members are provided are shifted to the upper, lower, right or left side, a connection between the wiring can be realized at a high success ratio.

Figure 12:
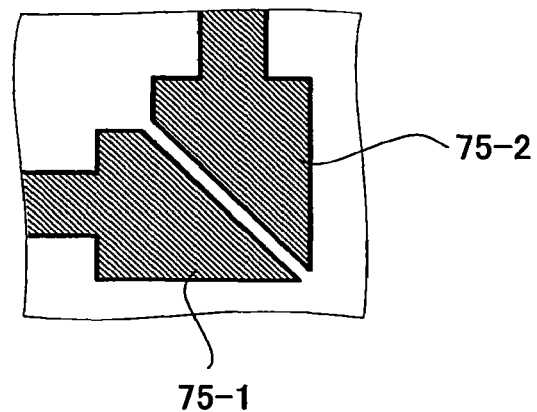
FIG. 12 is a plan view showing a configuration of an end part of a wiring in another example of the bump bonding connection part.
Figure 13:
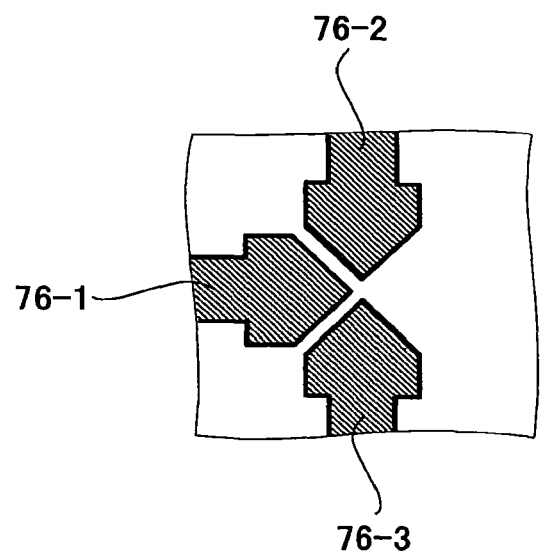
FIG. 13 is a plan view showing a configuration of an end part of a wiring in another example of the bump bonding connection part.
Figure 14:
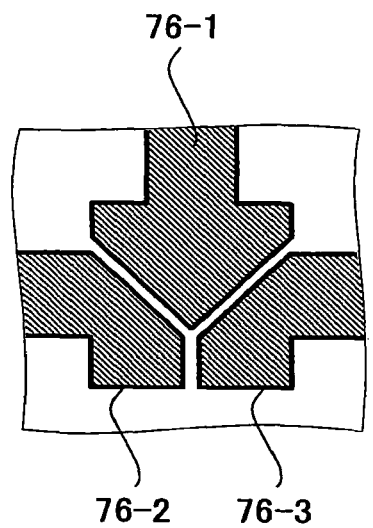
FIG. 14 is a plan view showing a configuration of an end part of a wiring in another example of the bump bonding connection part.

In a case where extending directions of the wirings to be connected are substantially perpendicular to each other, as shown in FIG. 12, end parts 75-1 and 75-2 of the wirings may be formed in line symmetry where a part where the end parts are separated is the axis of the symmetry. Furthermore, in a case where the bump connection part is formed at the end parts of three wirings, as shown in FIG. 13 or FIG. 14, end parts 76-1 through 76-3 of the wirings can be formed so that a head end part of the end part 76-1 of the wiring forms an acute angle on two sides and the end parts 76-2 and 76-3 of the other wirings having sides parallel to the sides of the end part 76-1 are close but separated at a designated length.

Figure 15:
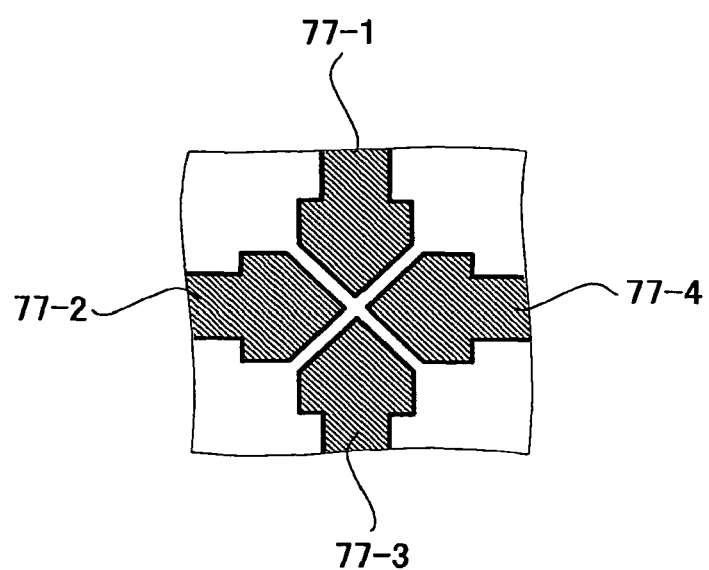
FIG. 15 is a plan view showing a configuration of an end part of a wiring in another example of the bump bonding connection part.

Furthermore, as shown in FIG. 15, in a case where four wirings whose arrangement directions are different by 90 degrees are provided, end parts 77-1 through 77-4 are formed where head ends of the end parts of the wirings are close but separated at a designated length.

In structures shown in FIG. 12 through FIG. 15, it is preferable that width of the connection part be greater than the width of the wiring part and the length of a part where the end parts face each other is set to be long.

Referring back to FIG. 9, the insulation film 162 is formed on the wiring part 70A of the fifth wiring 70 and the seventh wiring 90. Discussion of the material for the insulation film 162 is omitted here.

An opening part is formed in a part covering the end part of the wiring of the insulation film 162. A metal plating whose main surface has a substantially rectangular-shaped configuration is provided in the opening part. Discussion of the material for the metal plating part 164 is omitted here.

Figure 16:
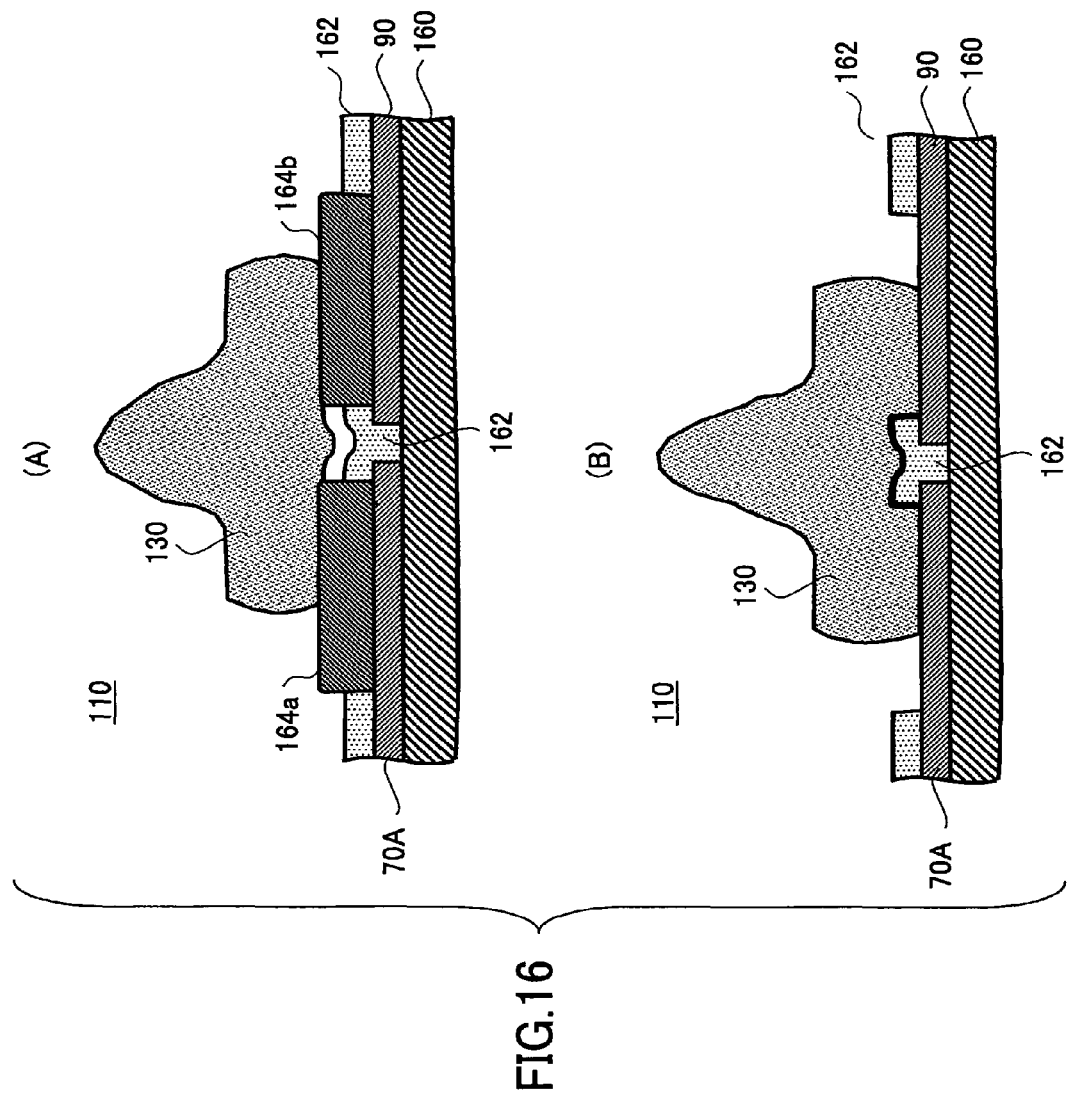
FIG. 16 is a cross-sectional view showing an arrangement structure of a stud bump and the bump connection part.

An arrangement of the stud bump 130 to the bump connection part 110 having the above-discussed structure is shown in FIG. 16. Here, FIG. 16 is a cross-sectional view showing the arrangement of the stud bump 130 to the bump connection part 110.

Referring to FIG. 16-(A), the stud bump 130 is provided so that the position of the stud bump 130 is higher than the insulation film 162 covering the wirings 70A and 90 facing each other. The stud bump 130 bridges the metal plating parts 164a and 164b formed on the end parts of the wirings.

The surface of the metal plating part 164 is higher than the surface of the insulation film 162. Hence, it is possible to securely connect the stud bump 130 and therefore a good yield of the relay board can be maintained.

The insulation film 162 and the metal plating part 164 are not always required to be formed. In this case, the connection member such as the stud bump 130 is formed so as to bridge the end parts of the wirings 70A and 90 facing each other. This is shown in FIG. 16-(B).

Figure 17:
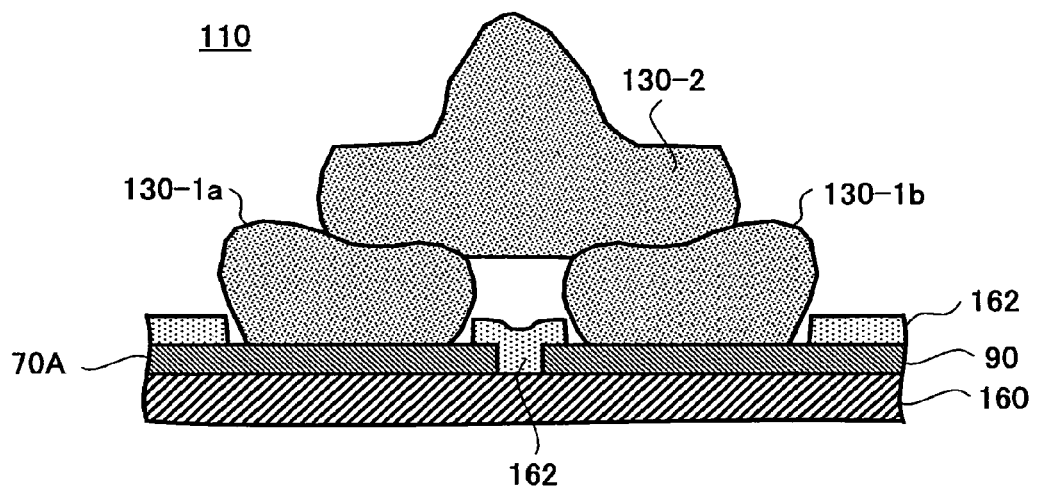
FIG. 17 is a cross-sectional view showing another arrangement structure of a stud bump and the bump connection part.

The arrangement of the stud bump may be a structure shown in FIG. 17. Here, FIG. 17 is a cross-sectional view showing another arrangement of the stud bump 130 and the bump connection part 110.

Referring to FIG. 17, a stud bump 130-1a is provided on a part where the insulation film 162 is not provided at the end part of the wiring part 70A. A stud bump 130-1b is provided on a part where the insulation film 162 is not provided at the end part of the seventh wiring 90. A stud bump 130-2 is provided so as to bridge the stud bumps 130-1a and 130-1b.

In a structure shown in FIG. 16-(B), the stud bump 130 is provided on the wirings 70A and 90 so as to cover the insulation film 162. Because of this, a contact area of the stud bump 130 and the wirings 70A and 90 may be reduced so that contact strength of the stud bump 130 may be low.

On the other hand, in a structure shown in FIG. 17, the wire 70A and the stud bump 130-1a are connected having a sufficiently large area and the wiring 90 and the stud bump 130-1b are connected having a sufficiently large area. Therefore, it is possible to obtain high connection strength and secure electrical connection between the wiring 70A and the stud bump 130-1a and high connection strength and secure electrical connection between the wiring 90 and the stud bump 130-1b.

Next, a connection structure of the bonding wires 54 and 155 to the second bonding pad 52E' (See FIG. 5) is discussed with reference to FIG. 18. Here, FIG. 18 is a view showing the connection structure of the bonding wires 54 and 155 to the second bonding pad 52E'.

The bonding wire 155 is connected to a part of the second bonding pad 52E shown in FIG. 4 which is next to a part where the bonding wire 54 is connected. On the other hand, the bonding wire 54 is stuck on the bonding wire 155 situated on the second bonding pad 52E' shown in FIG. 5.

Figure 18:
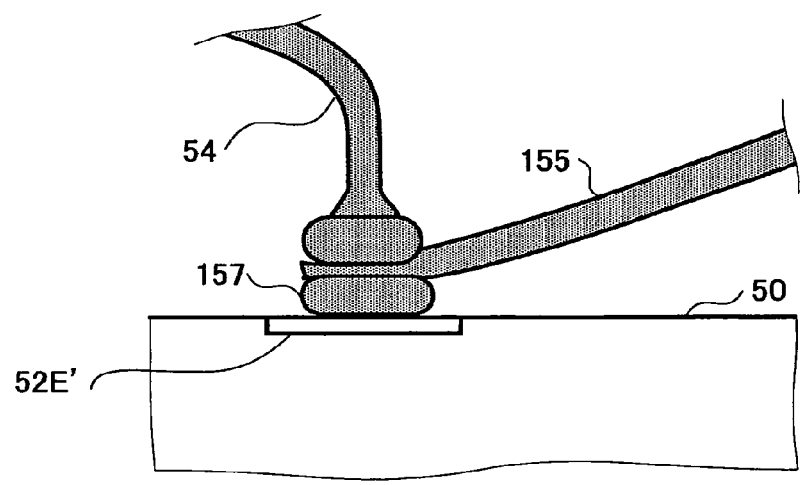
FIG. 18 is a view showing a connection structure of a bonding wire to a second bonding pad.

In a connection structure shown in FIG. 18, a stud bump 157 is provided on the second bonding pad 52E' provided on the relay board 50. Another end part of the bonding wire 155 connecting to the bonding wire connection part 60c formed on the end part of the tenth wire 150 connected by the first bonding pad 51E shown in FIG. 5 is connected on the stud bump 157.

Furthermore, the bonding wire 54 configured to electrically connect the wiring board or the lead frame and the relay board 50 is stuck on and connected to the bonding wire 155.

Thus, the bonding wires 54 and 155 are stuck and connected. Therefore, it is possible to make an area of the second bonding pad 52E' small and make the size of the relay board 50 small.

Furthermore, since the stud bump 157 is provided on the second bonding pad 52E', it is possible for the bonding wire 155 to be situated higher by the height of the stud bump 157. Accordingly, it is possible to prevent the bonding wire 155 from dropping and coming in contact with another wire.

In addition, since the bonding wire 155 is put between the bonding wire 54 and the stud bump 157, it is possible to increase contact-capability between the bonding wires 54 and 155.

As discussed above, in the relay board 50 of this embodiment of the present invention shown in FIG. 4 and FIG. 5, the end part of the wiring connected by the first bonding pad 51 and the end part of the wiring connected by the second bonding pad 52, the first bonding pad 51 and the end part of the wiring connected by the second bonding pad 52, or the second bonding pad 52 and the end part of the wiring connected by the first bonding pad 51, are connected by the connection member such as the bonding wire or the stud bump formed on the connection part of the wiring.

Based on the combination of the semiconductor chip where the relay board 50 is mounted or the wiring board and the relay board 50, it is possible to easily select which connection part where the stud bump or the bonding wire is to be connected.

Because of this, it is possible to apply the relay board 50 to a different semiconductor device. Hence, it is possible to reduce a manufacturing cost of the relay board 50 and the semiconductor device having the relay board 50.

In addition, the relay board 50 can be placed in wide use. Hence, it is possible to improve the degree of freedom of the combination of the semiconductor chip mounted on the wiring board or the lead frame.

Furthermore, to which bonding pad of the relay board 50 the wire bonding is applied can be optionally set. Hence, it is possible to improve the yield.

In addition, in the relay board 50, in a case where the connection between the first and second bonding pads 51 and 52 can be changed by using the above-mentioned connection member 130 or the bonding wire 155, the pad functioning as a preliminary bonding pad in a certain configuration can be used as a first or second bonding pad in a different configuration.

Thus, the relay board 50 can be placed in wide use. Hence, it is possible to improve the degree of freedom of the combination of the semiconductor chip mounted on the wiring board or the lead frame.

Next, a first modified example of the relay board 50 of the embodiment of the present invention is discussed with reference to FIG. 19 and FIG. 20.

Figure 19:
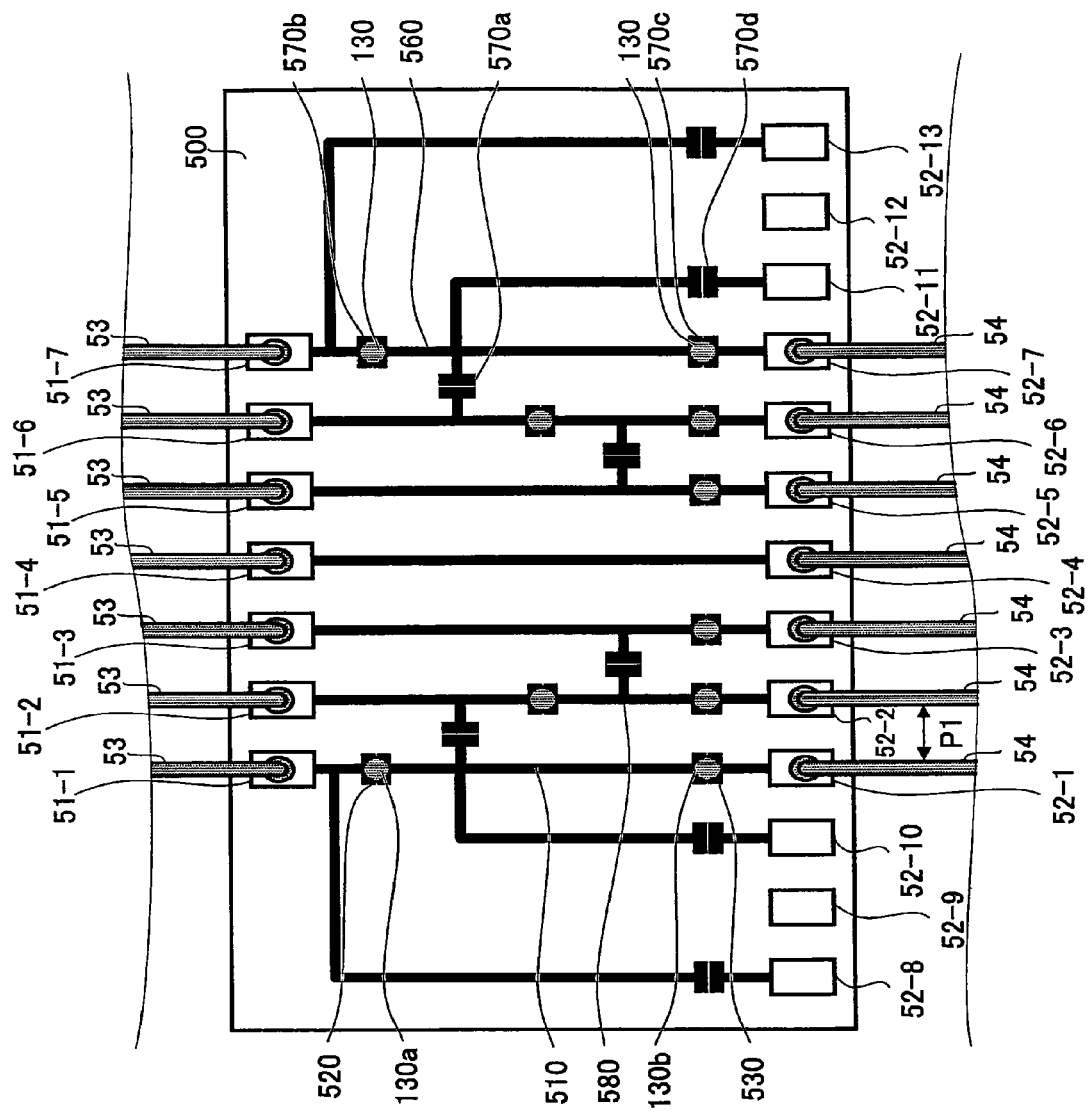
FIG. 19 is a first plan view of a schematic structure of a first modified example of the relay board of the embodiment of the present invention.

FIG. 19 is a first plan view of a schematic structure of the first modified example of the relay board of the embodiment of the present invention. FIG. 20 is a second plan view of a schematic structure of the first modified example of the relay board of the embodiment of the present invention.

Figure 20:
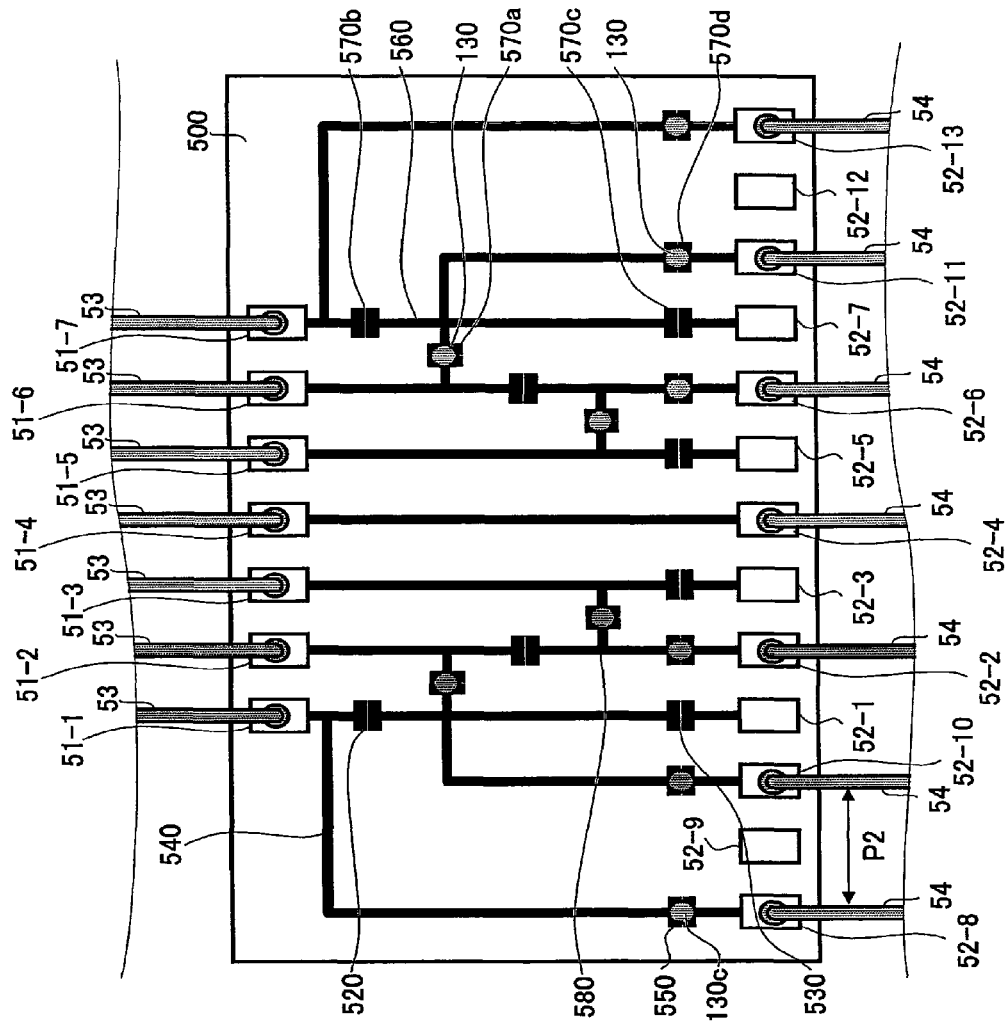
FIG. 20 is a second plan view of a schematic structure of a first modified example of the relay board of the embodiment of the present invention.

Referring to FIG. 19 and FIG. 20, first bonding pads 51-1 through 51-7 are provided along a side (upper side in FIG. 19 and FIG. 20) of the relay board 500 whose main surface has a rectangular-shaped configuration. Bonding wires 53 configured to electrically connect the semiconductor chip and the relay board 500 are connected to the first bonding pads 51-1 through 51-7.

In addition, second bonding pads 52-1 through 52-13 are provided along the other side (lower side in FIG. 19 and FIG. 20) of the relay board 500. Bonding wires 54 configured to electrically connect another semiconductor chip, the wiring board or the lead frame and the relay board 500 are connected to the second bonding pads 52-1 through 52-7. The bonding wires 54 are not connected to the second bonding pads 52-8 through 52-13 and the second bonding pads 52-8 through 52-13 function as preliminary bonding pads.

In the relay board 500, as well as the relay board 50 shown in FIG. 4 and FIG. 5, the wiring where the bump connection part is selectively provided is provided between the first bonding pad 51 and the second bonding pad 52.

By selectively providing the stud bump to the bump connection part, it is possible to convert the connection state between the bonding pad 51 and the bonding pad 52.

In the structure shown in FIG. 19, for example, the wirings extending from the bonding pads 51-1 and 52-1 and the wiring 510 provided corresponding to the wirings are connected by the stud bumps 130a and 130b provided at the connection parts 520 and 530, respectively, so that the bonding pads 51-1 and 52-1 can be electrically connected.

On the other hand, in the structure shown in FIG. 20, stud bumps 130a and 130b are not provided at the connection parts 520 and 530 between the wirings extending from the bonding pads 51-1 and 52-1 and the wiring 510 provided corresponding to the wirings, so that the bonding pads 51-1 and 52-1 are not electrically connected. Rather, a stud bump 130c is provided at the connection part 550 between another wiring 540 extending from the bonding pad 51-1 and the wiring extending from the bonding pad 52-8, so that the bonding pads 51-1 and 52-8 can be electrically connected.

Thus, by selecting an arrangement part of the stud bump between the wiring ends facing each other, it is possible to select or change the bonding pads 51 and 52 to be electrically connected.

As a result of this, it is possible to selectively change the pitch between the pads, namely the distance between the neighboring second bonding pads 52. For example, a pitch P2 between the bonding pads 52-8 and 52-10 in FIG. 20 is twice as long as a pitch P1 between the bonding pads 52-1 and 52-2 in FIG. 19. Hence, it is possible to make the gap between neighboring bonding wires 54 large so that contact among the bonding wires can be prevented.

In the relay board 500 shown in FIG. 19 and FIG. 20, a wiring extending (bending) in three or four directions is applied as a wiring connecting the bonding pad 51 and the other bonding pad 52.

For example, wirings 560 extending in four directions are provided in an area between the bonding pad 51-6 or 51-7 and bonding pad 52-7 or 52-11. End parts of the wiring 560 face end parts of the wirings extending from the bonding pads 51-6, 51-7, 52-7, or 52-11 so that the end parts form four connection parts 570a, 570b, 570c and 570d. By selectively providing stud bumps 130 to the connection parts, it is possible to select a state where the bonding pads 51-7 and 52-7 can be electrically connected as shown in FIG. 19 or a state where the bonding pads 51-6 and 52-11 can be electrically connected as shown in FIG. 20.

In addition, it is also possible to select a state where the bonding pads 51-6 and 52-7 can be electrically connected or a state where the bonding pads 51-7 and 52-11 can be electrically connected.

Similarly, by applying a wiring extending in three directions such as a T-shaped wiring 580, it is possible to select or change corresponding bonding pads.

Thus, by the wiring 560 extending in three or four directions, it is possible to improve the degree of freedom of the wiring way whereby the first and second bonding pads 51 and 52 are connected.

Next, a second modified example of the relay board of the embodiment of the present invention is discussed with reference to FIG. 21.

Figure 21:
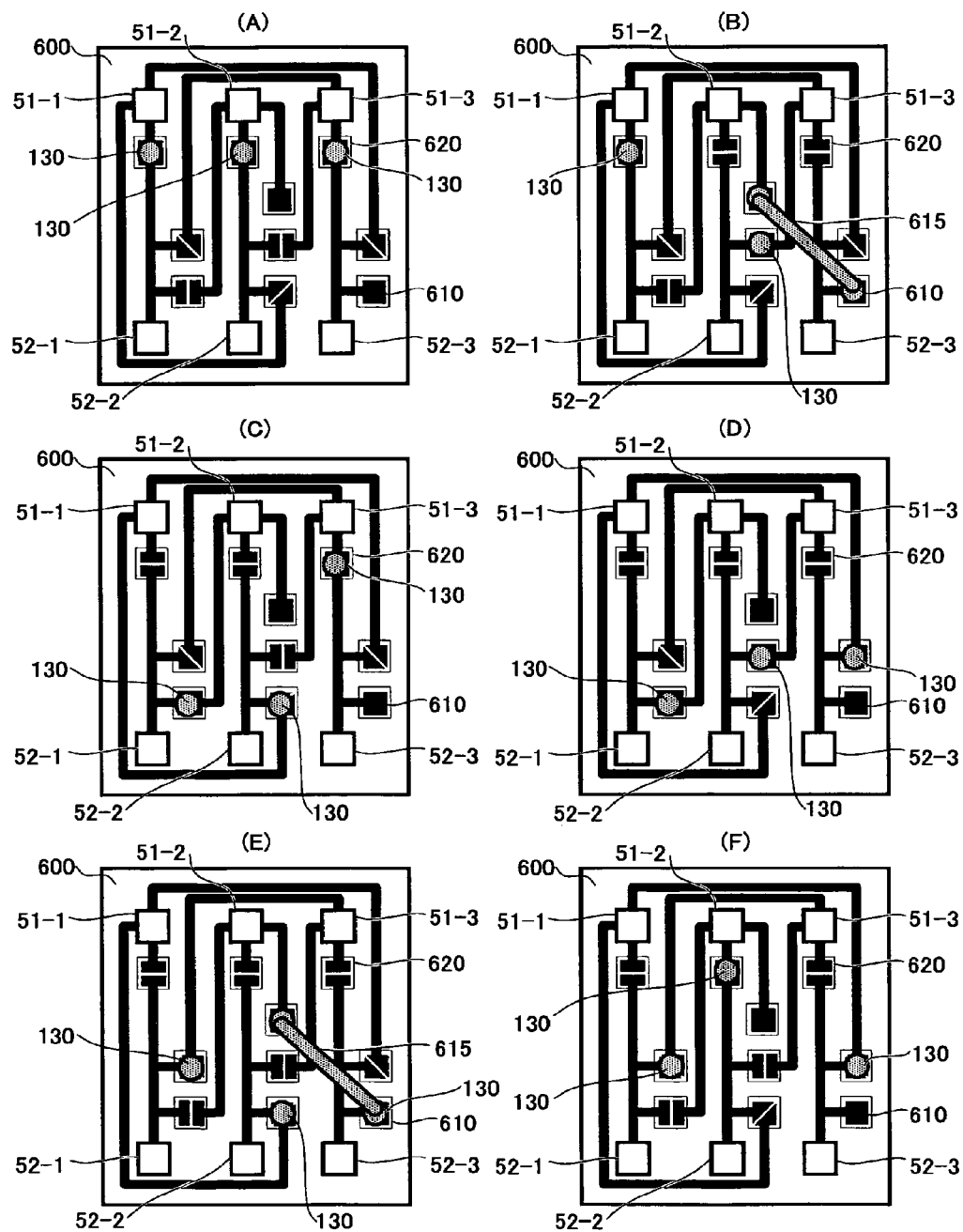
FIG. 21 is a plan view of a schematic structure of a second modified example of the relay board of the embodiment of the present invention.

FIG. 21 is a plan view of a schematic structure of the second modified example of the relay board of the embodiment of the present invention.

Referring to FIG. 21, first bonding pads 51-1 through 51-3 are provided along an upper side of the relay board 500 whose main surface has a rectangular-shaped configuration. Bonding wires (not shown in FIG. 21) configured to electrically connect the semiconductor chip and the relay board 600 are connected to the first bonding pads 51-1 through 51-3.

In addition, second bonding pads 52-1 through 52-3 are provided along a lower side of the relay board 600. Bonding wires configured to electrically connect another semiconductor chip, the wiring board or the lead frame and the relay board 600 are connected to the second bonding pads 52-1 through 52-3.

In the relay board 600, as well as the relay board 50 shown in FIG. 4 and FIG. 5, the wiring is provided between the first bonding pad 51 and the second bonding pad 52. Bonding wire connection parts 610 and/or bump connection parts 620 are provided in the wirings.

A boning wire 615 is connected to the selected bonding wire connection part 610 or the stud bump 130 is formed at the selected bump connection part 620, so that the first bonding pad 51 and the second bonding pad 52 can be electrically connected.

In the example shown in FIG. 21, three first bonding pads 51-1 through 51-3 and three second bonding pads 52-1 through 52-3 are provided. Therefore, there are six combinations, as a maximum, of electrical connection of the pads.

As shown in FIG. 21, the wirings between the first bonding pads 51 and the second bonding pads 52, the bonding wire connection parts 610 or the bump connection parts 620 for the wirings are provided in the relay board 600. The wire connection parts 610 or the bump connection parts 620 to be used for providing the stud bumps 130 and/or the bonding wires 615 can be selected.

As a result of this, it is possible to change the way or structure of connection between the first bonding pads 51 and the second bonding pads 52. Hence, it is possible to realize six ways of connection.

In an example shown in FIG. 21-(a), a stud bump 130 is selected as a connection member so that a first bonding pad 51-1 and a second bonding pad 52-1 can be electrically connected; a first bonding pad 51-2 and a second bonding pad 52-2 can be electrically connected; and a first bonding pad 51-3 and a second bonding pad 52-3 can be electrically connected.

In an example shown in FIG. 21-(b), a stud bump 130 and a bonding wire 615 are selected as connection members so that the first bonding pad 51-1 and the second bonding pad 52-1 can be electrically connected; the first bonding pad 51-2 and the second bonding pad 52-3 can be electrically connected; and the first bonding pad 51-3 and the second bonding pad 52-2 can be electrically connected.

In an example shown in FIG. 21-(c), the stud bump 130 is selected as a connection member so that the first bonding pad 51-1 and the second bonding pad 52-2 can be electrically connected; the first bonding pad 51-2 and the second bonding pad 52-1 can be electrically connected; and the first bonding pad 51-3 and the second bonding pad 52-3 can be electrically connected.

In an example shown in FIG. 21-(d), the stud bump 130 is selected as a connection member so that the first bonding pad 51-1 and the second bonding pad 52-3 can be electrically connected; the first bonding pad 51-2 and the second bonding pad 52-1 can be electrically connected; and the first bonding pad 51-3 and the second bonding pad 52-2 can be electrically connected.

In an example shown in FIG. 21-(e), the stud bump 130 and the bonding wire 615 are selected as connection members so that the first bonding pad 51-1 and the second bonding pad 52-2 can be electrically connected; the first bonding pad 51-2 and the second bonding pad 52-3 can be electrically connected; and the first bonding pad 51-3 and the second bonding pad 52-1 can be electrically connected.

In an example shown in FIG. 21-(f), the stud bump 130 is selected as the connection member so that the first bonding pad 51-1 and the second bonding pad 52-3 can be electrically connected; the first bonding pad 51-2 and the second bonding pad 52-2 can be electrically connected; and the first bonding pad 51-3 and the second bonding pad 52-1 can be electrically connected.

Next, a third modified example of the relay board of the embodiment of the present invention is discussed with reference to FIG. 22 through FIG. 24.

Figure 22:
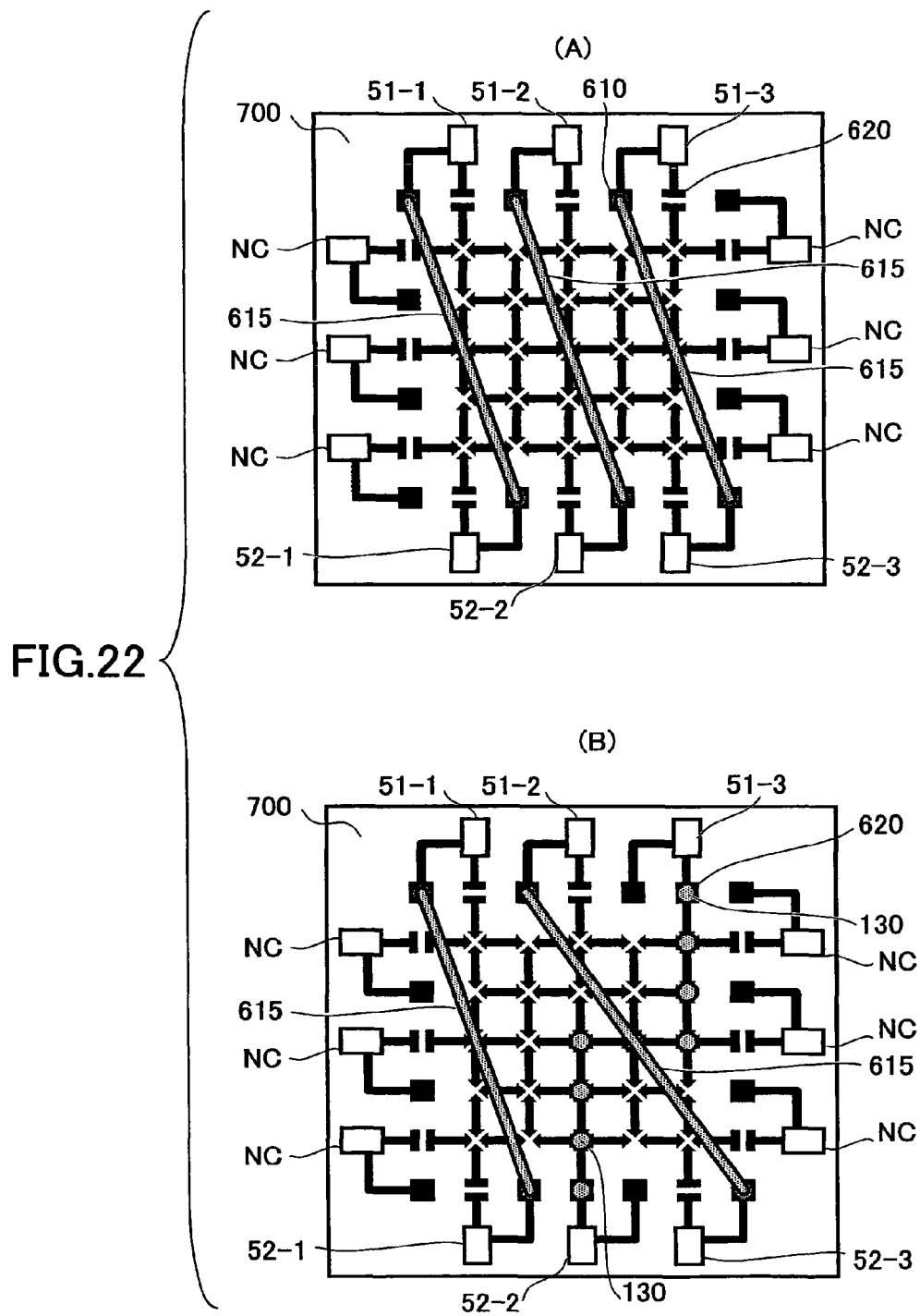
FIG. 22 is a first plan view of a schematic structure of a third modified example of the relay board of the embodiment of the present invention.
Figure 23:
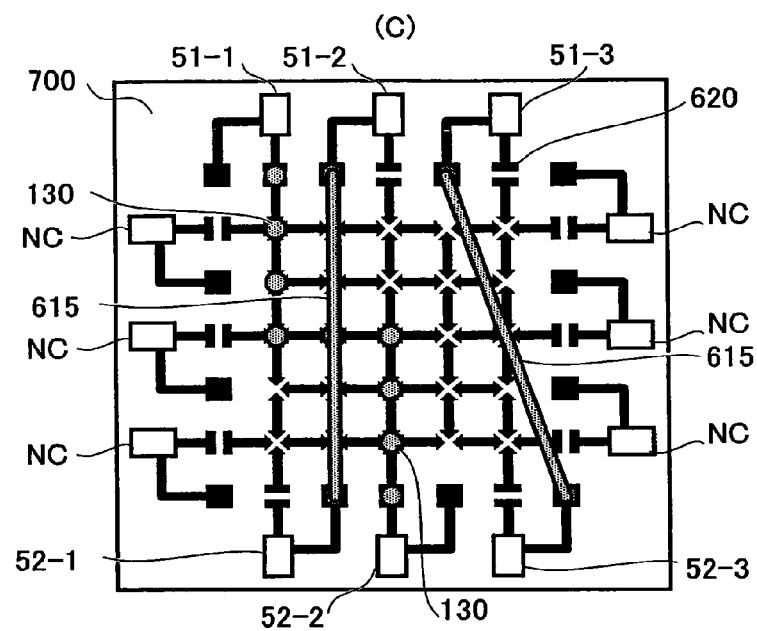
FIG. 23 is a second plan view of a schematic structure of a third modified example of the relay board of the embodiment of the present invention.
Figure 23:
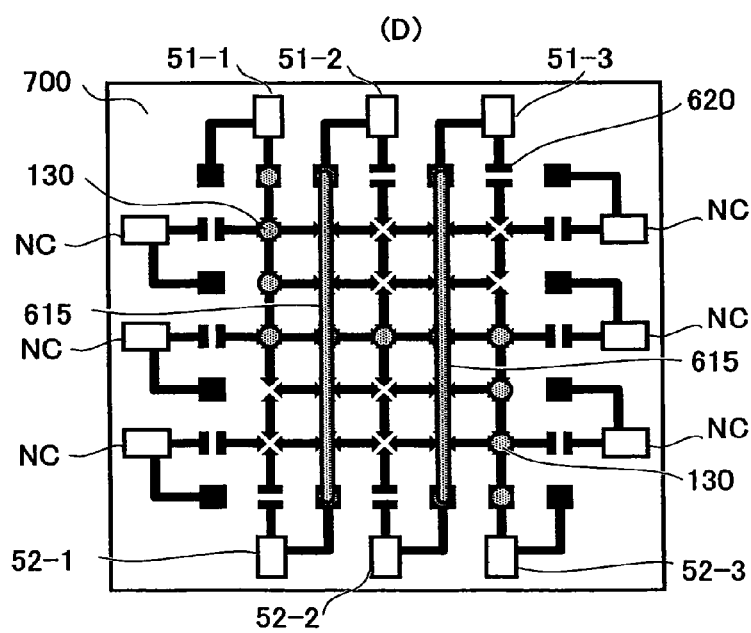
Figure 24:
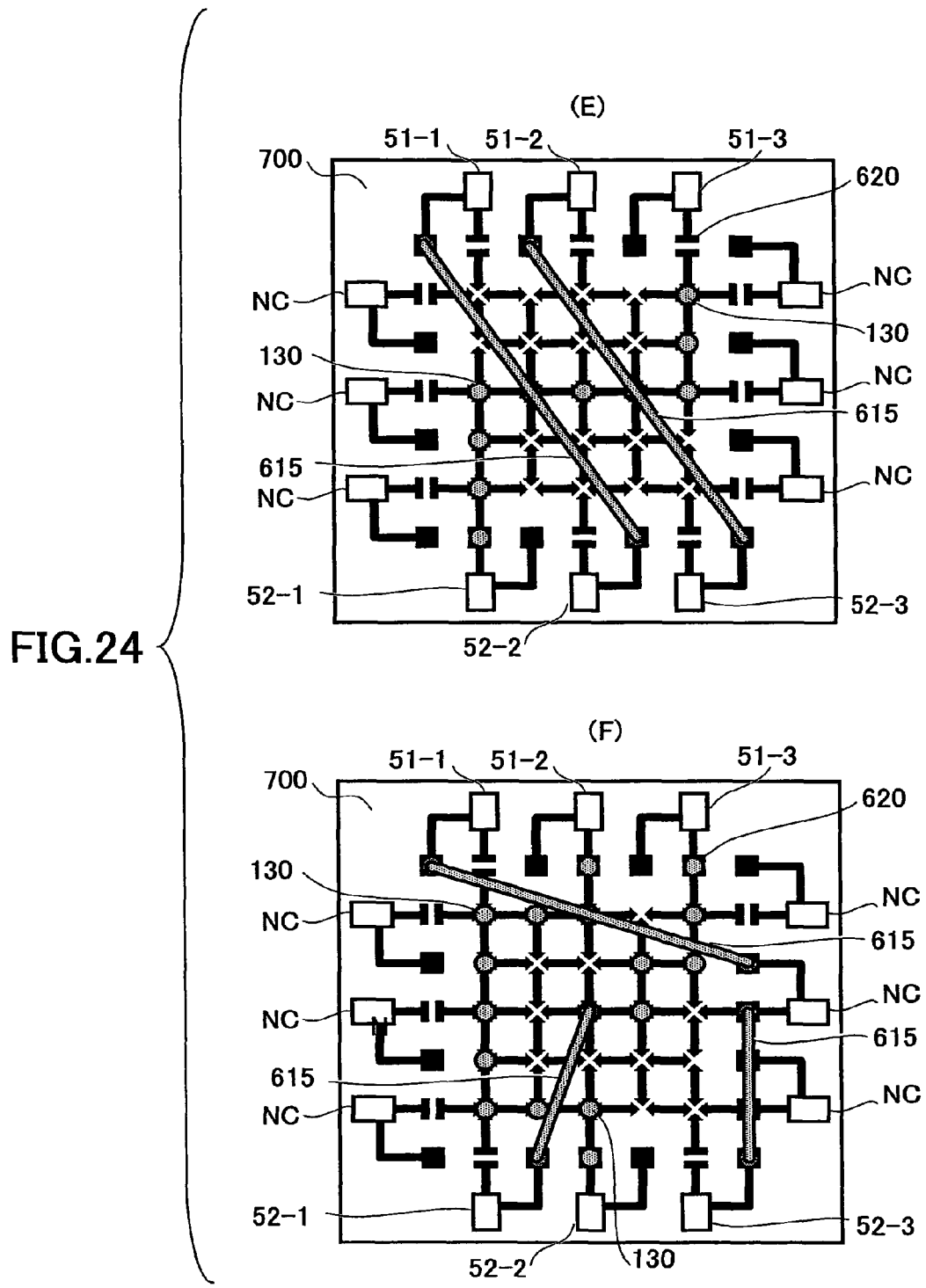
FIG. 24 is a third plan view of a schematic structure of a third modified example of the relay board of the embodiment of the present invention.

FIG. 22 through FIG. 24 are plan views of the schematic structure of the third modified example of the relay board of the embodiment of the present invention.

Referring to FIG. 22 through FIG. 24, first bonding pads 51-1 through 51-3 are provided along an upper side of a relay board 700 whose main surface has a rectangular-shaped configuration. Bonding wires (not shown in FIG. 22 through FIG. 24) configured to electrically connect the semiconductor chip and the relay board 700 are connected to the first bonding pads 51-1 through 51-3.

In addition, second bonding pads 52-1 through 52-3 are provided along a lower side of the relay board 600. Bonding wires (not shown in FIG. 22 through FIG. 24) configured to electrically connect other semiconductor chip, the wiring board or the lead frame and the relay board 700 are connected to the second bonding pads 52-1 through 52-3.

In the relay board 700 of this embodiment, wiring are provided between the first bonding pads 51 and the second bonding pads in a lattice state. Bonding wire connection parts 610 and/or bump connection parts 620 are provided at the respective wirings. A bonding wire 615 is provided at the bonding wire connection part 610 and a stud bump 130 is provided at the bump connection part 620 so that the first bonding pad 51 and the second bonding pad 52 can be electrically connected.

In FIG. 22 through FIG. 24, a pad indicated as "NC" means a preliminary bonding pad where a bonding wire configured to electrically connect other semiconductor chip, the wiring board or the lead frame and the relay board 700 is not connected.

In the example shown in FIG. 22 through FIG. 24, three first bonding pads 51-1 through 51-3 and three second bonding pads 52-1 through 52-3 are provided. Therefore, there are six combinations, as a maximum, of electrical connection of the pads.

As shown in FIG. 22 through FIG. 24, the wirings between the first bonding pads 51 and the second bonding pads 52, the bonding wire connection parts 610 or the bump connection parts 620 for the wirings are provided in the relay board 700.

The wire connection parts 610 or the bump connection parts 620 to be used for providing the stud bumps 130 and/or the bonding wires 615 can be selected.

As a result of this, it is possible to change the way or structure of connection between the first bonding pads 51 and the second bonding pads 52. Hence, it is possible to realize six ways of connection.

In an example shown in FIG. 22-(*a*), a first bonding pad 51-1 and a second bonding pad 52-1 can be electrically connected; a first bonding pad 51-2 and a second bonding pad 52-2 can be electrically connected; and a first bonding pad 51-3 and a second bonding pad 52-3 can be electrically connected.

In an example shown in FIG. 22-(*b*), the first bonding pad 51-1 and the second bonding pad 52-1 can be electrically connected; the first bonding pad 51-2 and the second bonding pad 52-3 can be electrically connected; and the first bonding pad 51-3 and the second bonding pad 52-2 can be electrically connected.

In an example shown in FIG. 23-(*c*), the first bonding pad 51-1 and the second bonding pad 52-2 can be electrically connected; the first bonding pad 51-2 and the second bonding pad 52-1 can be electrically connected; and the first bonding pad 51-3 and the second bonding pad 52-3 can be electrically connected.

In an example shown in FIG. 23-(*d*), the first bonding pad 51-1 and the second bonding pad 52-3 can be electrically connected; the first bonding pad 51-2 and the second bonding pad 52-1 can be electrically connected; and the first bonding pad 51-3 and the second bonding pad 52-2 can be electrically connected.

In an example shown in FIG. 24-(*e*), the first bonding pad 51-1 and the second bonding pad 52-2 can be electrically connected; the first bonding pad 51-2 and the second bonding pad 52-3 can be electrically connected; and the first bonding pad 51-3 and the second bonding pad 52-1 can be electrically connected.

In an example shown in FIG. 24-(*f*), the first bonding pad 51-1 and the second bonding pad 52-3 can be electrically connected; the first bonding pad 51-2 and the second bonding pad 52-2 can be electrically connected; and the first bonding pad 51-3 and the second bonding pad 52-1 can be electrically connected.

Next, a fourth modified example of the relay board of the embodiment of the present invention is discussed with reference to FIG. 25 through FIG. 27.

Figure 25:
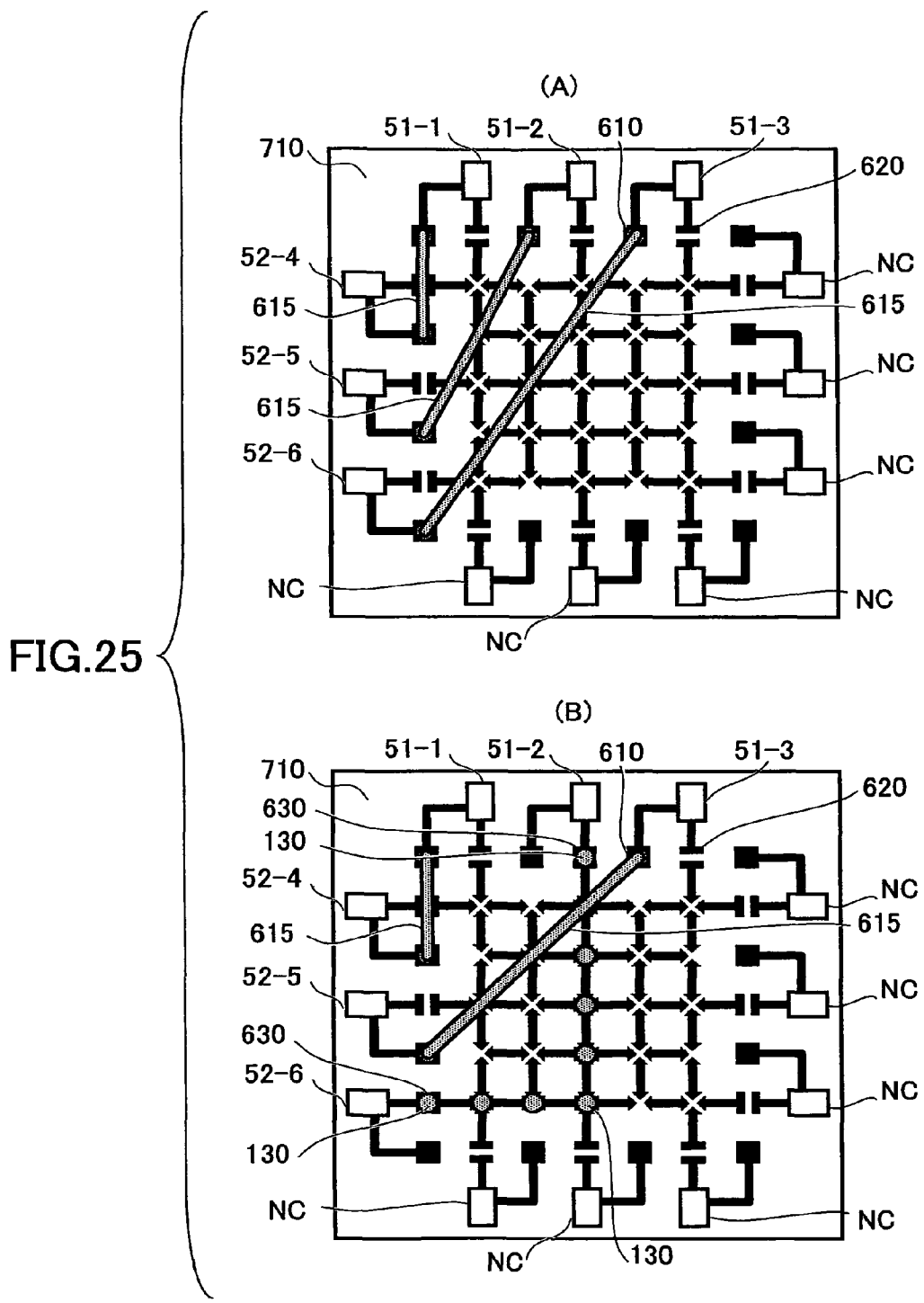
FIG. 25 is a first plan view of a schematic structure of a fourth modified example of the relay board of the embodiment of the present invention.
Figure 26:
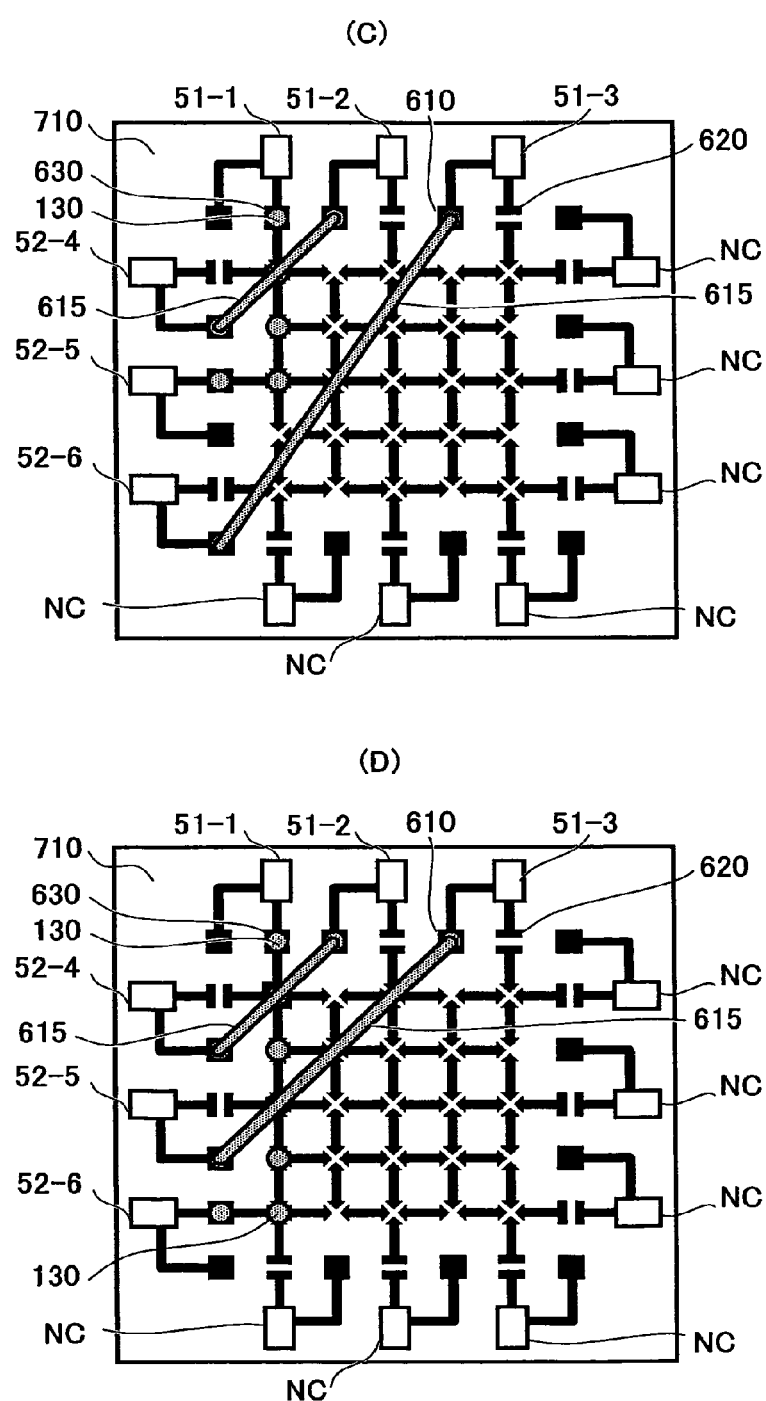
FIG. 26 is a second plan view of a schematic structure of a fourth modified example of the relay board of the embodiment of the present invention.
Figure 27:
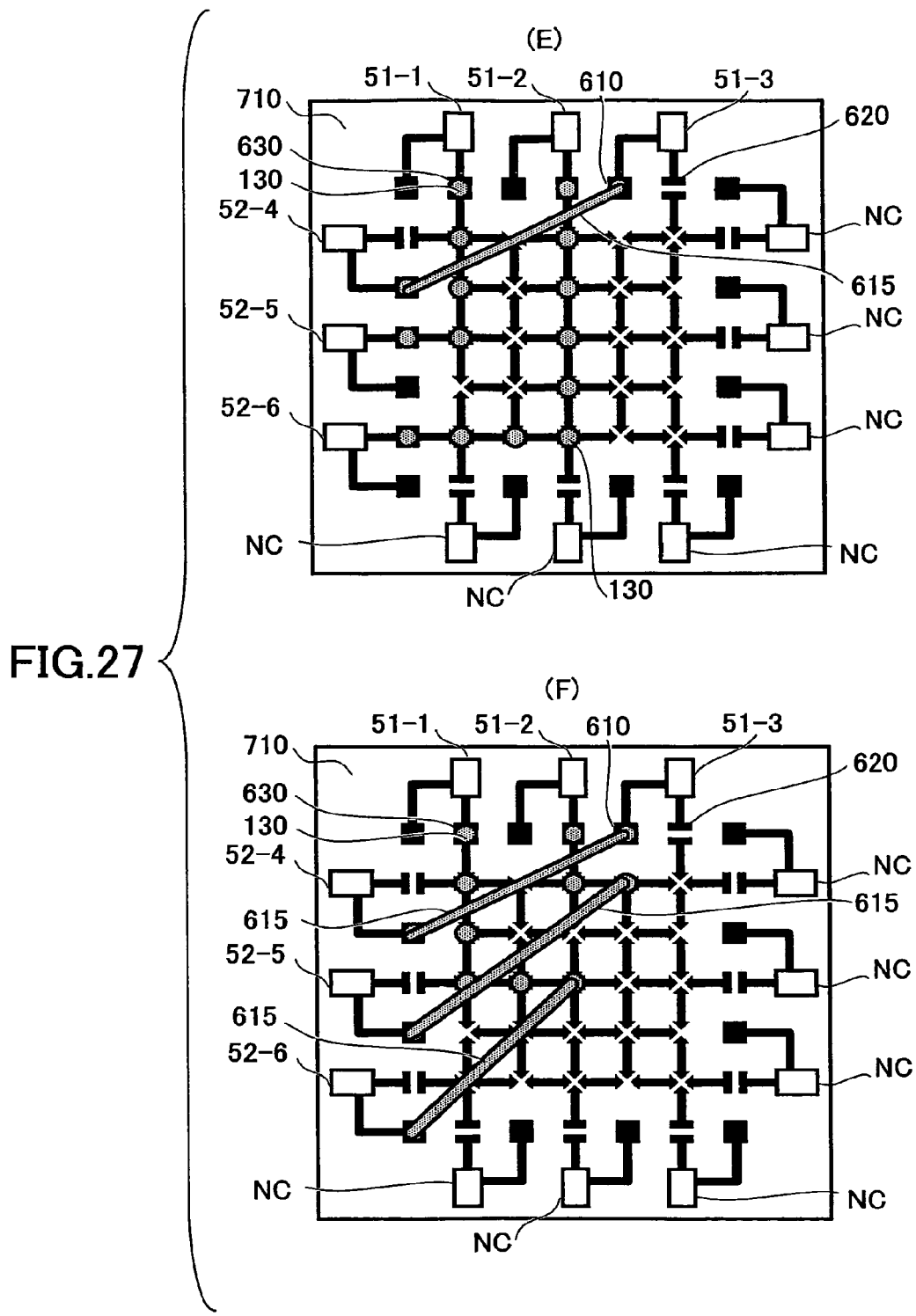
FIG. 27 is a third plan view of a schematic structure of a fourth modified example of the relay board of the embodiment of the present invention.

FIG. 25 through FIG. 27 are plan views of the schematic structure of the fourth modified example of the relay board of the embodiment of the present invention.

Referring to FIG. 25 through FIG. 27, first bonding pads 51-1 through 51-3 are provided along an upper side of a relay board 710 whose main surface has a rectangular-shaped configuration. Bonding wires (not shown in FIG. 25 through FIG. 27) configured to electrically connect the semiconductor chip and the relay board 710 are connected to the first bonding pads 51-1 through 51-3.

In addition, second bonding pads 52-4 through 52-6 are provided along a left side of the relay board 710. Bonding wires (not shown in FIG. 25 through FIG. 27) configured to electrically connect other semiconductor chip, the wiring board or the lead frame and the relay board 700 are connected to the second bonding pads 52-4 through 52-6.

Therefore, an arrangement direction of the first bonding pads 51-1 through 51-3 is substantially perpendicular to an arrangement direction of the second bonding pads 52-4 through 52-6.

In the relay board 700 of this embodiment, as well as the relay board 700 shown in FIG. 22 through FIG. 24, wirings are provided between the first bonding pads 51 and the second bonding pads in a lattice state. Bonding wire connection parts 610 and/or bump connection parts 620 are provided at the respective wirings. A bonding wire 615 is provided at the bonding wire connection part 610 and a stud bump 130 is provided at the bump connection part 620 so that the first bonding pad 51 and the second bonding pad 52 can be electrically connected.

In FIG. 25 through FIG. 27, a pad indicated as "NC" means a preliminary bonding pad where a bonding wire configured to electrically connect another semiconductor chip, the wiring board or the lead frame and the relay board 710 is not connected.

In the example shown in FIG. 25 through FIG. 27, three first bonding pads 51-1 through 51-3 and three second bonding pads 52-4 through 52-6 are provided. Therefore, there are six combinations, as a maximum, of electrical connection of the pads.

As shown in FIG. 25 through FIG. 27, the wirings between the first bonding pads 51 and the second bonding pads 52, the bonding wire connection parts 610 or the bump connection parts 620 for the wirings are provided in the relay board 700. The wire connection parts 610 or the bump connection parts 620 to be used for providing the stud bumps 130 and/or the bonding wires 615 can be selected.

As a result of this, it is possible to change a way or structure of connection between the first bonding pads 51 and the second bonding pads 52. Hence, it is possible to realize six ways of connection.

In an example shown in FIG. 25-(*a*), a first bonding pad 51-1 and a second bonding pad 52-4 can be electrically connected; a first bonding pad 51-2 and a second bonding pad 52-5 can be electrically connected; and a first bonding pad 51-3 and a second bonding pad 52-6 can be electrically connected.

In an example shown in FIG. 25-(*b*), the first bonding pad 51-1 and the second bonding pad 52-4 can be electrically connected; the first bonding pad 51-2 and the second bonding pad 52-6 can be electrically connected; and the first bonding pad 51-3 and the second bonding pad 52-5 can be electrically connected.

In an example shown in FIG. 26-(*c*), the first bonding pad 51-1 and the second bonding pad 52-5 can be electrically connected; the first bonding pad 51-2 and the second bonding pad 52-4 can be electrically connected; and the first bonding pad 51-3 and the second bonding pad 52-6 can be electrically connected.

In an example shown in FIG. 26-(*d*), the first bonding pad 51-1 and the second bonding pad 52-6 can be electrically connected; the first bonding pad 51-2 and the second bonding pad 52-4 can be electrically connected; and the first bonding pad 51-3 and the second bonding pad 52-5 can be electrically connected.

In an example shown in FIG. 27-(*e*), the first bonding pad 51-1 and the second bonding pad 52-5 can be electrically connected; the first bonding pad 51-2 and the second bonding pad 52-6 can be electrically connected; and the first bonding pad 51-3 and the second bonding pad 52-4 can be electrically connected.

In an example shown in FIG. 27-(*f*), the first bonding pad 51-1 and the second bonding pad 52-6 can be electrically connected; the first bonding pad 51-2 and the second bonding pad 52-5 can be electrically connected; and the first bonding pad 51-3 and the second bonding pad 52-4 can be electrically connected.

Next, a fifth modified example of the relay board of the embodiment of the present invention is discussed with reference to FIG. 28 and FIG. 29.

Figure 28:
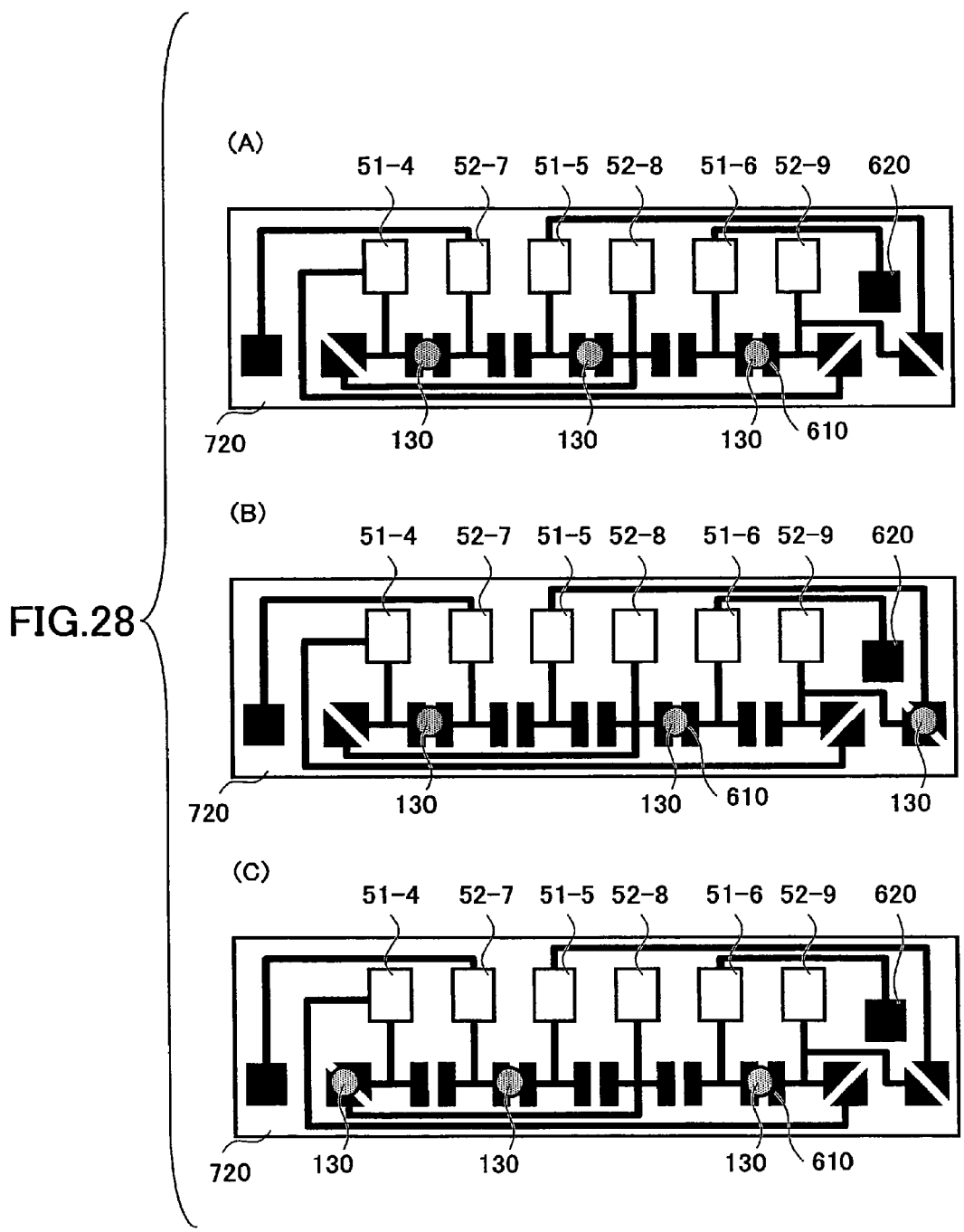
FIG. 28 is a first plan view of a schematic structure of a fifth modified example of the relay board of the embodiment of the present invention.
Figure 29:
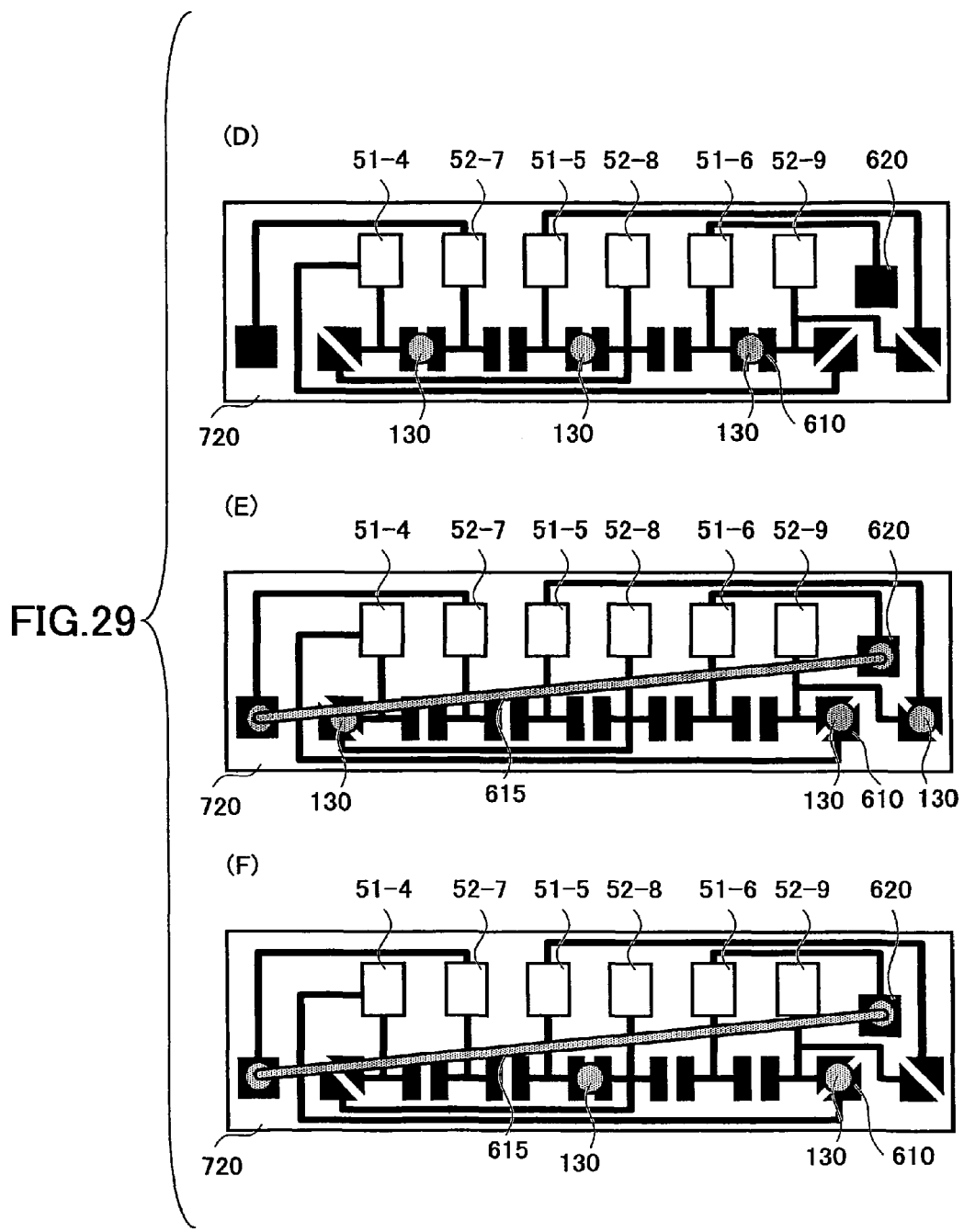
FIG. 29 is a second plan view of a schematic structure of a sixth modified example of the relay board of the embodiment of the present invention.

FIG. 28 and FIG. 29 are plan views of the schematic structure of the fifth modified example of the relay board of the embodiment of the present invention.

Referring to FIG. 28 and FIG. 29, first bonding pads 51-4 through 51-6 are provided along a longitudinal side of a relay board 720 whose main surface has a rectangular-shaped configuration. Bonding wires (not shown in FIG. 28 and FIG. 29) configured to electrically connect the semiconductor chip and the relay board 720 are connected to the first bonding pads 51-4 through 51-6.

In addition, along the longitudinal side of the relay board 720, a second bonding pad 52-7 is provided between the first bonding pads 51-4 and 51-5; a second bonding pad 52-8 is provided between the first bonding pads 51-5 and 51-6; and a second bonding pad 52-9 is provided at a right side of the first bonding pad 51-6.

Bonding wires (not shown in FIG. 28 and FIG. 29) configured to electrically connect another semiconductor chip, the wiring board or the lead frame and the relay board 720 are connected to the second bonding pads 52-7 through 52-9.

Therefore, the first bonding pads 51-4 through 51-6 and the second bonding pads 52-7 through 52-9 are arranged in a straight line state in the example shown in FIG. 28 and FIG. 29.

In the relay board 720 of this embodiment, as well as the relay board 50 shown in FIG. 4 and FIG. 5, wirings are provided between the first bonding pads 51 and the second bonding pads 52 in a lattice state. Bonding wire connection parts 610 and/or bump connection parts 620 are provided at the respective wirings. A bonding wire 615 is provided at the bonding wire connection part 610 and a stud bump 130 is provided at the bump connection part 620 so that the first bonding pad 51 and the second bonding pad 52 can be electrically connected.

In the example shown in FIG. 28 and FIG. 29, three first bonding pads 51-4 through 51-6 and three second bonding pads 52-7 through 52-9 are provided. Therefore, there are six combinations, as a maximum, of electrical connection of the pads.

As shown in FIG. 28 and FIG. 29, the wirings between the first bonding pads 51 and the second bonding pads 52, the bonding wire connection parts 610 or the bump connection parts 620 for the wirings are provided in the relay board 720. The wire connection parts 610 or the bump connection parts 620 to be used for providing the stud bumps 130 and/or the bonding wires 615 can be selected.

As a result of this, it is possible to change the way or structure of connection between the first bonding pads 51 and the second bonding pads 52. Hence, it is possible to realize six ways of connection.

In an example shown in FIG. 28-(*a*), a first bonding pad 51-4 and a second bonding pad 52-7 can be electrically connected; a first bonding pad 51-5 and a second bonding pad 52-8 can be electrically connected; and a first bonding pad 51-6 and a second bonding pad 52-9 can be electrically connected.

In an example shown in FIG. 28-(*b*), the first bonding pad 51-4 and the second bonding pad 52-7 can be electrically connected; the first bonding pad 51-5 and the second bonding pad 52-9 can be electrically connected; and the first bonding pad 51-6 and the second bonding pad 52-8 can be electrically connected.

In an example shown in FIG. 28-(*c*), the first bonding pad 51-4 and the second bonding pad 52-8 can be electrically connected; the first bonding pad 51-5 and the second bonding pad 52-7 can be electrically connected; and the first bonding pad 51-6 and the second bonding pad 52-9 can be electrically connected.

In an example shown in FIG. 29-(*d*), the first bonding pad 51-4 and the second bonding pad 52-9 can be electrically connected; the first bonding pad 51-5 and the second bonding pad 52-7 can be electrically connected; and the first bonding pad 51-6 and the second bonding pad 52-8 can be electrically connected.

In an example shown in FIG. 29-(*e*), the first bonding pad 51-4 and the second bonding pad 52-8 can be electrically connected; the first bonding pad 51-5 and the second bonding pad 52-9 can be electrically connected; and the first bonding pad 51-6 and the second bonding pad 52-7 can be electrically connected.

In an example shown in FIG. 29-(*f*), the first bonding pad 51-4 and the second bonding pad 52-9 can be electrically connected; the first bonding pad 51-5 and the second bonding pad 52-8 can be electrically connected; and the first bonding pad 51-6 and the second bonding pad 52-7 can be electrically connected.

[Semiconductor Device]

Next, a mounting structure of a relay board having a structure discussed above in a semiconductor device is discussed.

Figure 30:
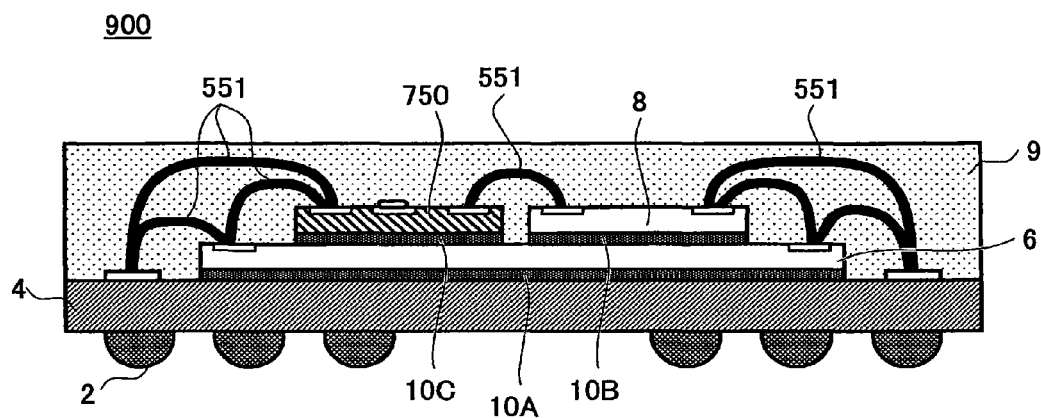
FIG. 30 is a view showing a first example of a semiconductor device having a relay board of the embodiment of the present invention.

FIG. 30 is a view showing a first example of a semiconductor device having a relay board of the embodiment of the present invention.

Referring to FIG. 30, a semiconductor device 900 is a so-called Ball Grid Array (BGA) package type semiconductor device.

A first semiconductor chip 6 is mounted on a wiring board 4 having a lower surface where plural spherical shaped electrodes (bumps) 2 are formed. The first semiconductor chip 6 is adhered and fixed to the wiring board 4 by an adhesive 10A.

A second semiconductor chip 8 and a relay board 750 are provided side by side on the first semiconductor chip 6. The second semiconductor chip 8 and the relay board 750 are adhered and fixed to the first semiconductor chip 6 by adhesives 10B and 10C.

An electrode of the wiring board 4 and an electrode of the first semiconductor chip 6 are connected by a bonding wire 551. The electrode of the wiring board 4 and an electrode of the second semiconductor chip 8 are connected by the bonding wire 551. The electrode of the wiring board 4 and an electrode of the relay board 750 are connected by the bonding wire 551. The electrode of the semiconductor chip 6 and the electrode of the second semiconductor chip 8 are connected by the bonding wire 551. The electrode of the relay board 750 and the electrode of the first semiconductor chip 6 are connected by the bonding wire 551. The electrode of the relay board 750 and the electrode of the second semiconductor chip 8 are connected by the bonding wire 551.

The first semiconductor chip 6, the second semiconductor chip 8, the relay board 750 and the bonding wires 551 are sealed by sealing resin so that the semiconductor device 900 is formed.

An organic substrate made of, for example glass epoxy, glass Bismaleimide-Triazine (BT), or polyimide or an inorganic substrate made of, for example, ceramic, glass, or silicon may be used as the wiring board 4. A resin adhesive paste or film made of, for example, epoxy or polyimide may be used as the adhesive 10. However, the present invention is not limited to the above-mentioned example.

In this example, it is possible to reduce the wiring length of the bonding wires 551 by providing the relay board 750. Therefore, it is possible to improve the yield of the semiconductor device 900 and to reduce the height of the wire loop of the bonding wire 551. As a result of this, the height of the semiconductor device 900 can be reduced so that it is possible to make the semiconductor device where the relay board is mounted thin.

Figure 31:
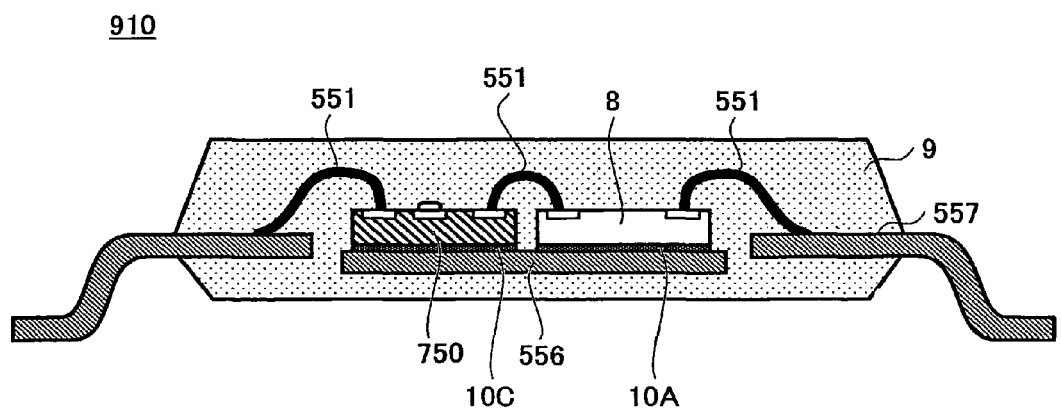
FIG. 31 is a view showing a second example of a semiconductor device having a relay board of the embodiment of the present invention.

FIG. 31 is a view showing a second example of a semiconductor device having the relay board of the embodiment of the present invention.

Referring to FIG. 31, a semiconductor device 910 has a structure where a semiconductor chip 8 and a relay board 750 are provided side by side on a dye pad (dye stage) 556 of a lead frame made of iron, copper, or the like. The semiconductor chip 8 is adhered and fixed to the dye pad 556 by an adhesive 10A. The relay board 750 is adhered and fixed to the dye pad 556 by an adhesive 10C.

An electrode of the semiconductor chip 8 and an electrode of the relay board 750 are connected by the bonding wire 551. An inner lead part 557 of the lead frame and the electrode of the relay board 750 are connected by the bonding wire 551. The electrode of the semiconductor chip 8 and the inner lead part 557 of the lead frame are connected by the bonding wire 551.

The semiconductor chip 8, the relay board 750, the inner lead part 557 and the bonding wires 551 are sealed by sealing resin so that the semiconductor device 910 is formed.

The same material for the adhesive 10 as the material discussed above with reference to FIG. 30 can be used.

In this example, it is possible to reduce the wiring length of the bonding wires 551 by providing the relay board 750. Therefore, it is possible to improve the yield of the semiconductor device 910 and to reduce the height of the wire loop of the bonding wire 551. As a result of this, the height of the semiconductor device 910 can be reduced so that it is possible to make the semiconductor device where the relay board is mounted thin.

Figure 32:
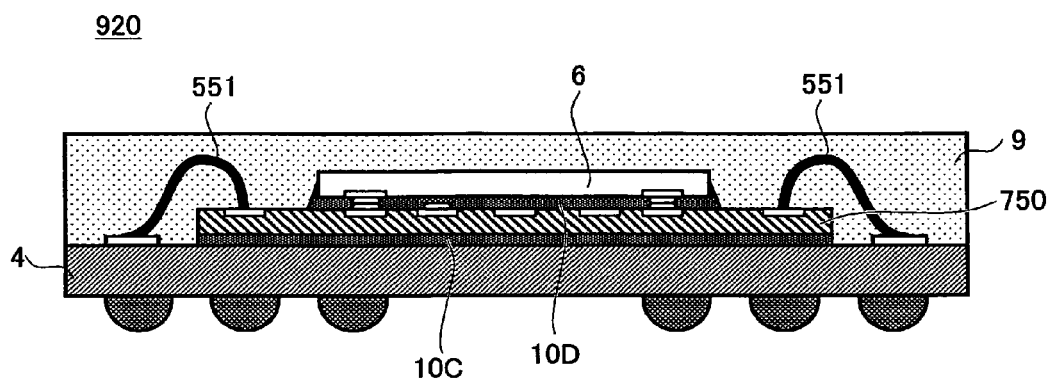
FIG. 32 is a view showing a third example of a semiconductor device having a relay board of the embodiment of the present invention.

FIG. 32 is a view showing a third example of a semiconductor device having the relay board of the embodiment of the present invention.

Referring to FIG. 32, a semiconductor device 920 has a structure where a relay board 750 is adhered and fixed on the wiring board 4 by adhesive 10C. A first semiconductor chip 6 is flip chip connected on the relay board 750 and adhered and fixed to the relay board 750 by the adhesive 10D.

An electrode of the wiring board 4 and an electrode of the relay board 750 are connected by the bonding wire 551.

The semiconductor chip 6, the relay board 750, and the bonding wires 551 are sealed by sealing resin 9 so that the semiconductor device 920 is formed.

The same materials for the adhesive 10 and the wiring board 4 as the materials discussed above with reference to FIG. 30 can be used.

In this example, the semiconductor chip 6 is flip chip connected to the relay board 750. Hence, as compared with a case where the relay board 750 and the semiconductor chip 6 are wire bonded, the height of the semiconductor device 920 can be reduced so that it is possible to make the semiconductor device where the relay board is mounted thin.

Figure 33:
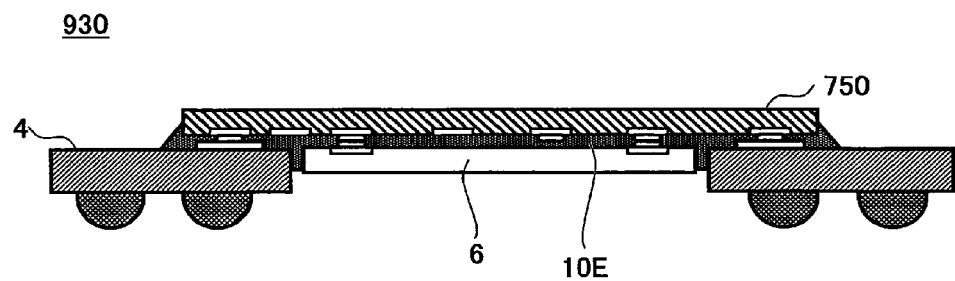
FIG. 33 is a view showing a fourth example of a semiconductor device having a relay board of the embodiment of the present invention.

FIG. 33 is a view showing a fourth example of a semiconductor device having the relay board of the embodiment of the present invention.

Referring to FIG. 33, a semiconductor device 930 has a structure where an opening part is formed in the substantially center part of the wiring board 4. A relay board 750 having an area larger than the opening part covers the opening part.

The semiconductor chip 6 is received in the opening part. An electrode of the semiconductor chip is connected and fixed to a corresponding electrode of the relay board 750. Another electrode of the relay board 750 is connected to a corresponding electrode of the wiring board 4.

The semiconductor chip 6 and the relay board 750 are adhered and fixed by the adhesive 10E.

The relay board 750 and the wiring board 4 are adhered and fixed by the adhesive 10E.

The same materials for the adhesive 10 and the wiring board 4 as the materials discussed above with reference to FIG. 30 can be used.

A bonding wire is not used in the semiconductor device 930 shown in FIG. 33. Hence, as compared with the semiconductor device 560 shown in FIG. 32, it is possible to obtain good electrical connection and the height of the semiconductor device 930 can be reduced so that it is possible to make the semiconductor device where the relay board is mounted thin.

Figure 34:
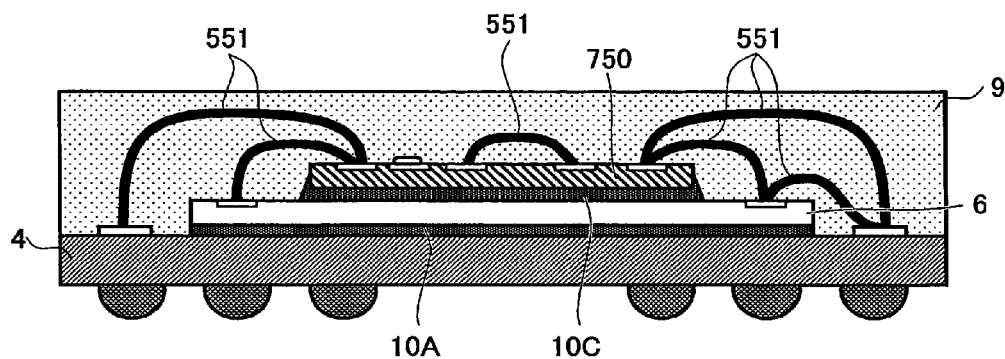
FIG. 34 is a view showing a fifth example of a semiconductor device having a relay board of the embodiment of the present invention.

FIG. 34 is a view showing a fifth example of a semiconductor device having a relay board of the embodiment of the present invention.

Referring to FIG. 30, a semiconductor device 940 has a structure where a relay board 750 is adhered and fixed on a semiconductor chip 6 by the adhesive 10C. The semiconductor chip 6 is adhered and fixed on a wiring board 4 by the adhesive 10A.

An electrode of the wiring board 4 and an electrode of the first semiconductor chip 6 are connected by a bonding wire 551. The electrode of the wiring board 4 and a relay board 750 are connected by the bonding wire 551. The electrode of the semiconductor chip 6 and the electrode of the relay board 750 are connected by the bonding wire 551.

The semiconductor chip 6, the relay board 750 and the bonding wires 551 are sealed by sealing resin 9 so that the semiconductor device 940 is formed.

The same materials for the adhesive 10 and the wiring board 4 as the materials discussed above with reference to FIG. 30 can be used.

In this example, the external size of the relay board 750 is less than the external size of the semiconductor chip 6. The relay board is provided on the semiconductor chip 6. Hence, it is possible to electrically connect the relay board 750 and the first semiconductor chip 6 without making the size of the semiconductor device 940 large.

Figure 35:
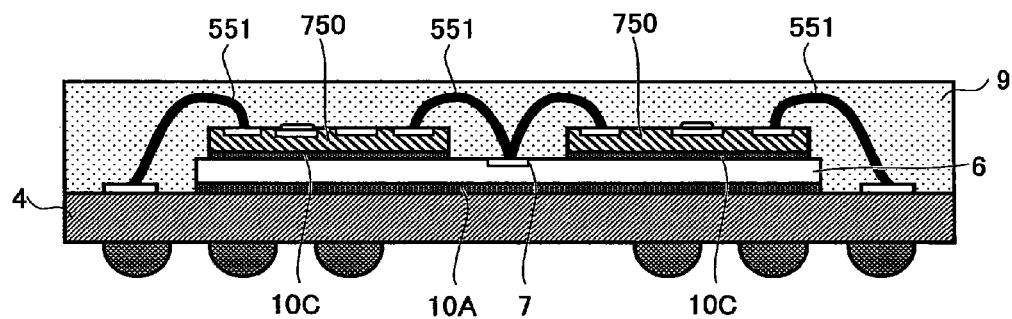
FIG. 35 is a view showing a sixth example of a semiconductor device having a relay board of the embodiment of the present invention.

FIG. 35 is a view showing a sixth example of a semiconductor device having a relay board of the embodiment of the present invention.

Referring to FIG. 35, a semiconductor device 950 has a structure where two relay boards 750 are adhered and fixed on a semiconductor chip 6 by the adhesive 10C. The semiconductor chip 6 is adhered and fixed on a wiring board 4 by the adhesive 10A.

An electrode pad 7 of the semiconductor chip 6 is provided in the substantially center part of the semiconductor chip 6. Electrodes of the relay boards 750 provided separately are connected to the electrode pad 7 of the semiconductor chip 6 and the wiring board 4.

The semiconductor chip 6, two relay boards 750 and the bonding wires 551 are sealed by sealing resin 9 so that the semiconductor device 950 is formed.

The same materials for the adhesive 10 and the wiring board 4 as the materials discussed above with reference to FIG. 30 can be used.

In this example, the relay boards 750 are provided on the semiconductor chip 6 so as to be received in the external configuration of the semiconductor chip 6. Hence, it is possible to electrically connect the relay board 750 and the first semiconductor chip 6 without making the size of the semiconductor device 950 large.

Figure 36:
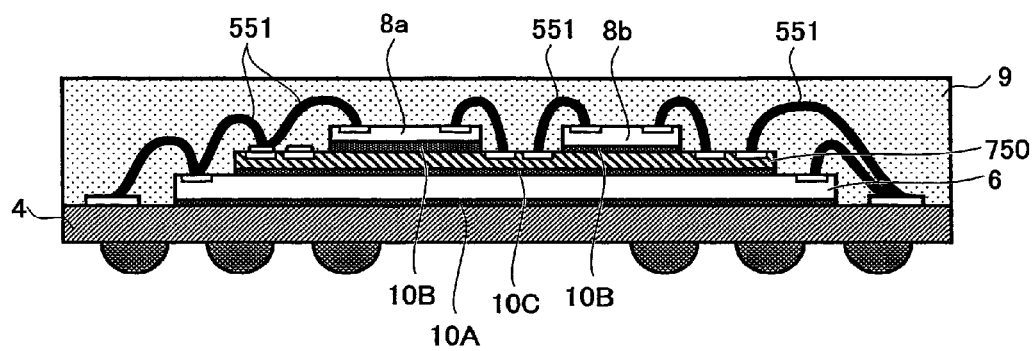
FIG. 36 is a view showing a seventh example of a semiconductor device having a relay board of the embodiment of the present invention.

FIG. 36 is a view showing a seventh example of a semiconductor device having a relay board of the embodiment of the present invention.

Referring to FIG. 36, the semiconductor device 960 has a structure where the relay board 750 is adhered and fixed to the semiconductor chip 6 by the adhesive 10C and the semiconductor chip 6 is adhered and fixed to the wiring board 4 by the adhesive 10A. Two semiconductor chips 8a and 8b are separately adhered and fixed on the relay board 750 by the adhesive 10E. That is, the semiconductor chips 8a and 8b are mounted on the semiconductor chip 6 via the relay board 750.

The wiring board 4 and the semiconductor chip 6 are connected by the bonding wire 551. The wiring board 4 and the relay board 750 are connected by the bonding wire 551. The relay board 750 and the semiconductor chips 8a and 8b are connected by the bonding wire 551.

The semiconductor chip 6, the semiconductor chips 8a and 8b, the relay board 750 and the bonding wires 551 are sealed by sealing resin 9 so that the semiconductor device 960 is formed.

The same materials for the adhesive 10 and the wiring board 4 as the materials discussed above with reference to FIG. 30 can be used.

In this example, the relay board 750 of the present invention which can be placed in wide use is provided between the semiconductor chip 3 and semiconductor chips 8a and 8b. Hence, it is possible to improve the degree of freedom of combinations of the stuck semiconductor chips.

Figure 37:
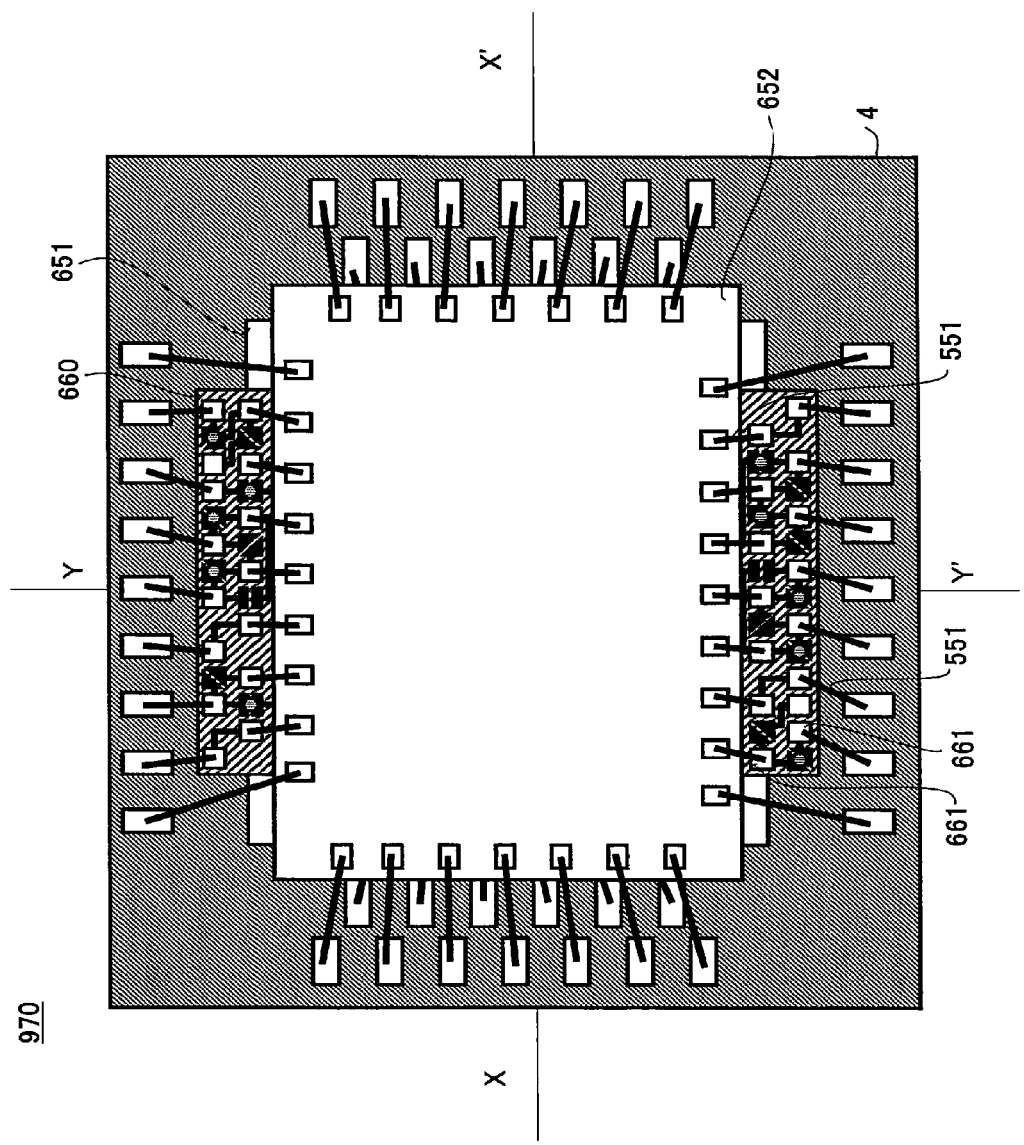
FIG. 37 is a view showing an eighth example of a semiconductor device having a relay board of the embodiment of the present invention.
Figure 38:
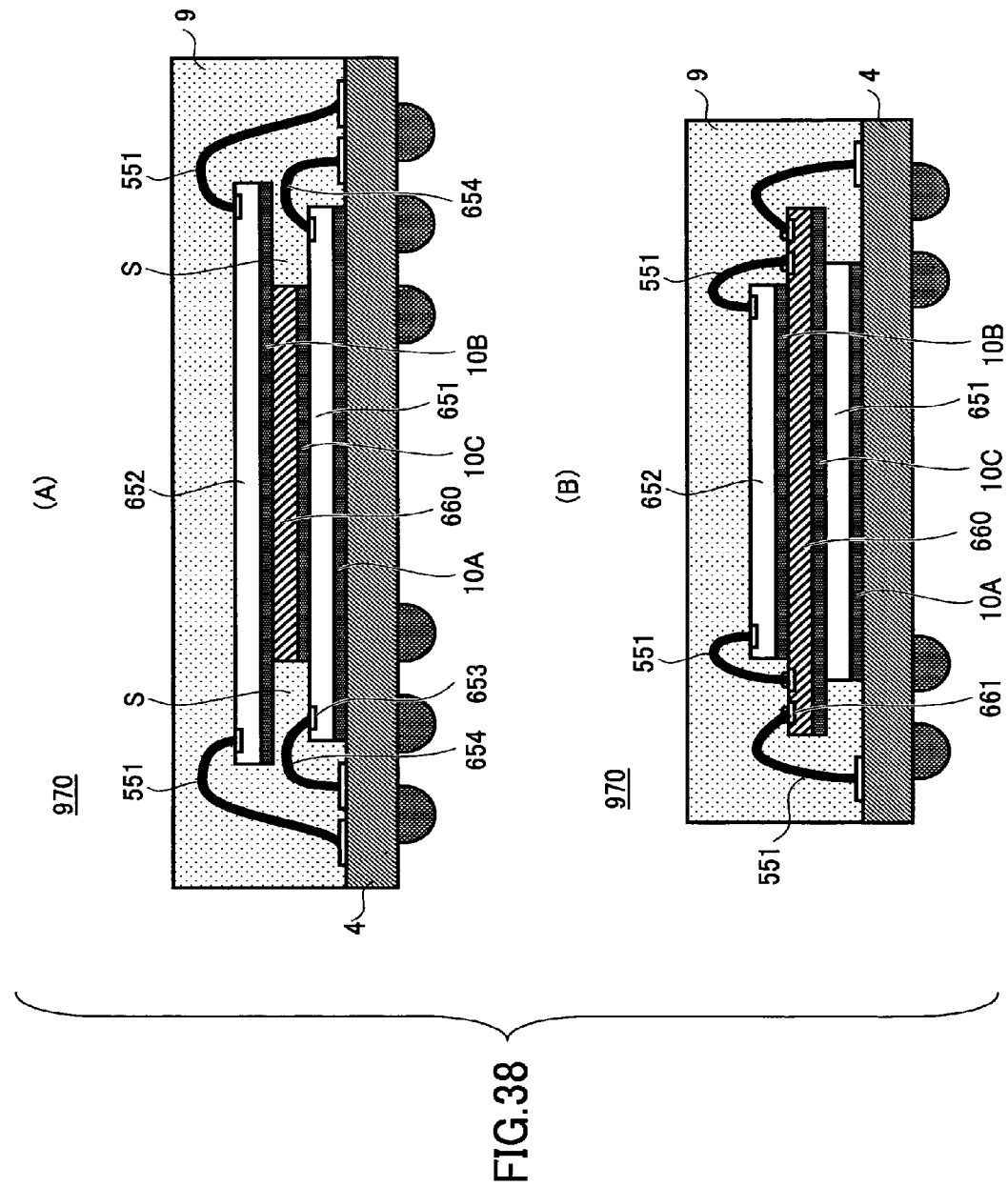
FIG. 38 is a view showing an eighth example of a semiconductor device having a relay board of the embodiment of the present invention.

FIG. 37 and FIG. 38 are views showing an eighth example of a semiconductor device having a relay board of the embodiment of the present invention. More-specifically, FIG. 37 is a plan view of a semiconductor device 970. FIG. 38-(A) is a cross-sectional view taken along line X-X' of FIG. 37. FIG. 38-(B) is a cross-sectional view taken along line Y-Y' of FIG. 37. For the convenience of the explanation, FIG. 37 shows the semiconductor device 970 in a state where the sealing resin 9 shown in FIG. 38 is not provided.

Referring to FIG. 37 and FIG. 38, in the semiconductor device 970, the first semiconductor chip 651 is adhered and fixed on the wiring board 4 by the adhesive 10A. The relay board 660 of the present invention is adhered and fixed on the first semiconductor chip 651 by the adhesive 10C. The second semiconductor chip 652 is adhered and fixed on the relay board 660 by the adhesive 10B. Therefore, the relay board 660 is put between the first semiconductor chip 651 and the second semiconductor chip 652.

The first semiconductor chip 651, the second semiconductor chip 652, the relay board 660 and the bonding wires 551 are sealed by sealing resin 9 so that the semiconductor device 970 is formed.

The same materials for the adhesive 10 and the wiring board 4 as the materials discussed above with reference to FIG. 30 can be used.

Under this structure, the length of the relay board 660 in an X-X' direction (See FIG. 37) is less than lengths of the first semiconductor chip 651 and the second semiconductor chip 652 in the X-X' direction (See FIG. 38-(A)). On the other hand, the length of the relay board 660 in the Y-Y' direction (See FIG. 37) is greater than the lengths of the first semiconductor chip 651 and the second semiconductor chip 652 in the Y-Y' direction (See FIG. 38-(B)).

Hence, as shown in FIG. 38-(B), a bonding pad 661 provided in the vicinity of an end part of the relay board 660 in the Y-Y' direction is connected to the wiring board 4 and the second semiconductor chip 652 by the bonding wire 551.

On the other hand, as shown in FIG. 38-(A), the relay board 660 forms a space S between the first semiconductor chip 651 and the second semiconductor chip 652.

More specifically, the relay board 660 provided between the semiconductor chip 651 and the second semiconductor chip 652 is positioned so as not to overlap an electrode pad 653 provided in the vicinity of an end part of the first semiconductor chip 651 (See FIG. 38-(A)) in the X-X' direction. The relay board 660 is positioned so as to overlap the electrode pad 653 where the relay board 660 is separated from the second semiconductor chip 652 at a designated length.

Under this structure, as shown in FIG. 38-(A), the second semiconductor chip 652 and the wiring board 4 are connected by the bonding wire 551. The electrode pad 653 of the first semiconductor chip 651 and an electrode pad of the wiring board 4 are connected by the bonding wire 654.

Thus, the relay board 660 forms the space S between the first semiconductor chip 651 and the second semiconductor chip 652. Therefore, it is possible to connect the first semiconductor chip 651 and the wiring board 4 without making the bonding wire 654 contact the second semiconductor chip 652 situated above the bonding wire 654.

The structures of the semiconductor devices of the present invention are discussed above. In a manufacturing process of such a semiconductor device, the connection member may be provided at the connection part provided in the relay board after the relay board is provided on the semiconductor chip or the wiring board.

Furthermore, the relay board may be provided on the semiconductor chip or the wiring board after the connection member is provided on the relay board in advance.

From the view point for easy manufacturing with existed equipment but without special equipment, it is preferable that the connection member be provided on the relay board after the relay board is provided on the semiconductor chip or the wiring board. As a result of this, it is possible to improve the yield.

The present invention is not limited to these embodiments, but variations and modifications may be made without departing from the scope of the present invention.

What is claimed is:

1. A semiconductor device, comprising:
at least a single semiconductor element;
a wiring board or a lead frame; and
a relay board,
wherein the semiconductor element and the wiring board or the lead frame are connected by the relay board; and
the relay board includes a first terminal, a second terminal, a first terminal wire, a second terminal wire and a first connection wire, wherein
the first terminal wire is connected to the first terminal,
the second terminal wire is connected to the second terminal,
the first terminal wire and the first connection wire are connected by a first connection member, and
the first terminal and the second terminal are electrically connected by at least the first terminal wire, the first connection member, the first connection wire and the second terminal wire.

2. The semiconductor device as claimed in claim 1, wherein
the first connection member includes a stud bump.

3. The semiconductor device as claimed in claim 2, wherein the stud bump includes first through third stud bumps;
the first stud bump is formed at an end part of the first terminal wire;

the second stud bump is formed at an end part of the first connection wire; and the third stud bump is stuck onto the first stud bump and the second stud bump.

4. The semiconductor device as claimed in claim 1, wherein the first connection member includes conductive resin.

5. The semiconductor device as claimed in claim 1, wherein the number of the first terminal and the number of the second terminal are plural respectively;

an arrangement direction of the first terminals is substantially in parallel with an arrangement direction of the second terminals; and the arrangement order of the first terminals is different from the arrangement order of the second terminals corresponding to the first terminals.

6. The semiconductor device as claimed in claim 1, wherein the second terminal wire and the first connection wire are connected by a second connection member.

7. The semiconductor device as claimed in claim 6, wherein the second connection member is a stud bump.

8. The semiconductor device as claimed in claim 1, wherein the relay board further comprises a second connection wire, and the first terminal wire, the first connection wire and the second connection wire are connected by the first connection member.

9. The semiconductor device as claimed in claim 8, wherein the relay board further comprises a third connection wire, and the first terminal wire, the first connection wire, the second connection wire and the third connection wire are connected by the first connection member.

10. The semiconductor device as claimed in claim 1, wherein the relay board further comprises a third terminal, a fourth terminal, a third terminal wire and a bonding wire, the third terminal wire is connected to the third terminal, the bonding wire is connected to the third terminal wire, and the third terminal and the fourth terminal are electrically connected by at least the third terminal wire and the bonding wire.

11. The semiconductor device as claimed in claim 10, wherein the relay board further comprises a fourth terminal wire, the fourth terminal wire is connected to the fourth terminal, and the third terminal wire and the fourth terminal wire are connected by the bonding wire.

12. The semiconductor device as claimed in claim 1, wherein at least one of the first terminal wire, the second terminal wire and the first connection wire is branched.

13. A semiconductor device, comprising:
at least a single semiconductor element;
a wiring board or a lead frame; and
a relay board,
wherein the semiconductor element and the wiring board or the lead frame are connected by the relay board; and
the relay board includes a first terminal, a second terminal, a first terminal wire and a first bonding wire, wherein
the first terminal wire is connected to the first terminal,
the first bonding wire is connected to the first terminal wire, and
the first terminal and the second terminal are electrically connected by at least the first terminal wire and the first bonding wire.

14. The semiconductor device as claimed in claim 13, further comprising:
a stud bump formed on the second terminal; and
a second bonding wire which electrically connects the second terminal to the wiring board or the lead frame, wherein
an end part of the first bonding wire is formed on the stud bump; and
an end part of the second bonding wire is formed on the end part of the first bonding wire.

15. The semiconductor device as claimed in claim 13, wherein the first bonding wire connects the first terminal wire and the second terminal.

16. The semiconductor device as claimed in claim 13, wherein
the relay board further includes a second terminal wire,
the second terminal wire is connected to the second terminal, and
the first bonding wire connects the first terminal wire and the second terminal wire.

17. The semiconductor device as claimed in claim 13, wherein the first terminal wire is branched.

* * * * *